United States Patent
Ohri et al.

(10) Patent No.: US 8,629,484 B2
(45) Date of Patent: Jan. 14, 2014

(54) SOLID-STATE IMAGING DEVICE, METHOD OF MANUFACTURING SOLID-STATE IMAGING DEVICE, AND ELECTRONIC APPARATUS

(75) Inventors: Hiroyuki Ohri, Kanagawa (JP); Takashi Machida, Kanagawa (JP); Takahiro Kawamura, Kanagawa (JP); Yasunori Sogoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 106 days.

(21) Appl. No.: 13/053,455

(22) Filed: Mar. 22, 2011

(65) Prior Publication Data

US 2011/0241089 A1 Oct. 6, 2011

(30) Foreign Application Priority Data

Mar. 31, 2010 (JP) ................................. 2010-083600

(51) Int. Cl.
*H01L 27/146* (2006.01)

(52) U.S. Cl.
USPC .................... 257/290; 257/444; 257/E27.132; 438/78

(58) Field of Classification Search
CPC ................. H01L 27/14612; H01L 27/14616; H01L 27/14609; H01L 27/14638; H01L 27/14656

USPC ......... 257/229–231, 233, 257, 258, 290–292, 257/443–445, E27.132, E27.133, E31.085; 438/78, 79

See application file for complete search history.

(56) References Cited

U.S. PATENT DOCUMENTS

| 2009/0251582 A1 | 10/2009 | Oike |
| 2009/0256176 A1 * | 10/2009 | Kobayashi et al. ........... 257/225 |
| 2011/0241079 A1 * | 10/2011 | Oike et al. ...................... 257/225 |

FOREIGN PATENT DOCUMENTS

JP 2009-268083 11/2009

* cited by examiner

*Primary Examiner* — Yu Chen
(74) *Attorney, Agent, or Firm* — Dentons US LLP

(57) ABSTRACT

Disclosed herein is a solid-state imaging device including: a semiconductor region of a second conductivity type which is formed on a face side of a semiconductor substrate; a photoelectric conversion element which has an impurity region of a first conductivity type and which is operable to generate electric charge according to the amount of incident light and to accumulate the electric charge in the inside thereof; an electric-charge holding region which has an impurity region of the first conductivity type and in which the electric charge generated through photoelectric conversion by the photoelectric conversion element is held until read out; an intermediate transfer path through which only the electric charge generated by the photoelectric conversion element during an exposure period and being in excess of a predetermined electric charge amount is transferred into the electric-charge holding region; and an impurity layer.

11 Claims, 19 Drawing Sheets

FIG. 5
FIRST STEP
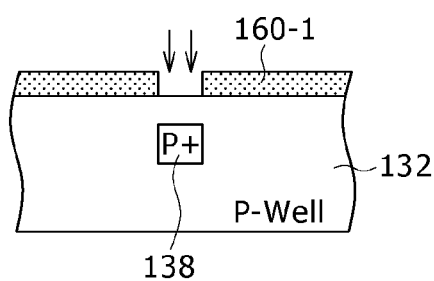
FOURTH STEP
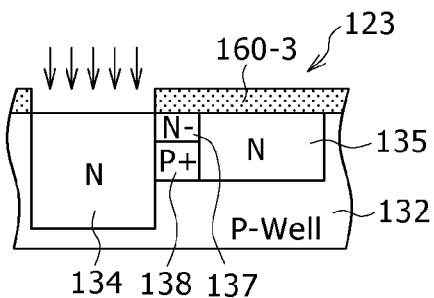
SECOND STEP
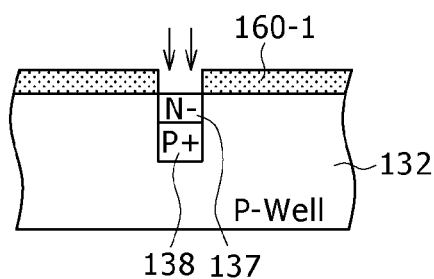
FIFTH STEP
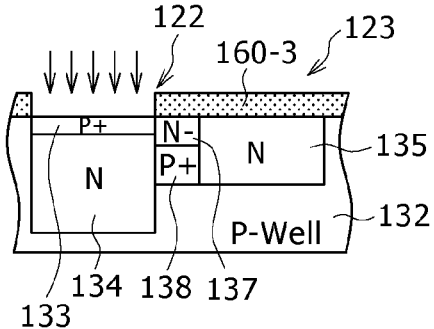
THIRD STEP
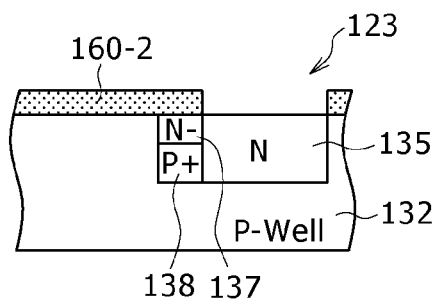
SIXTH STEP
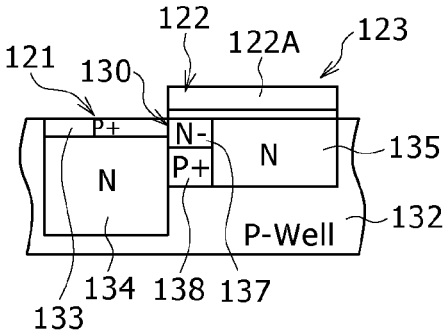

FIG.8
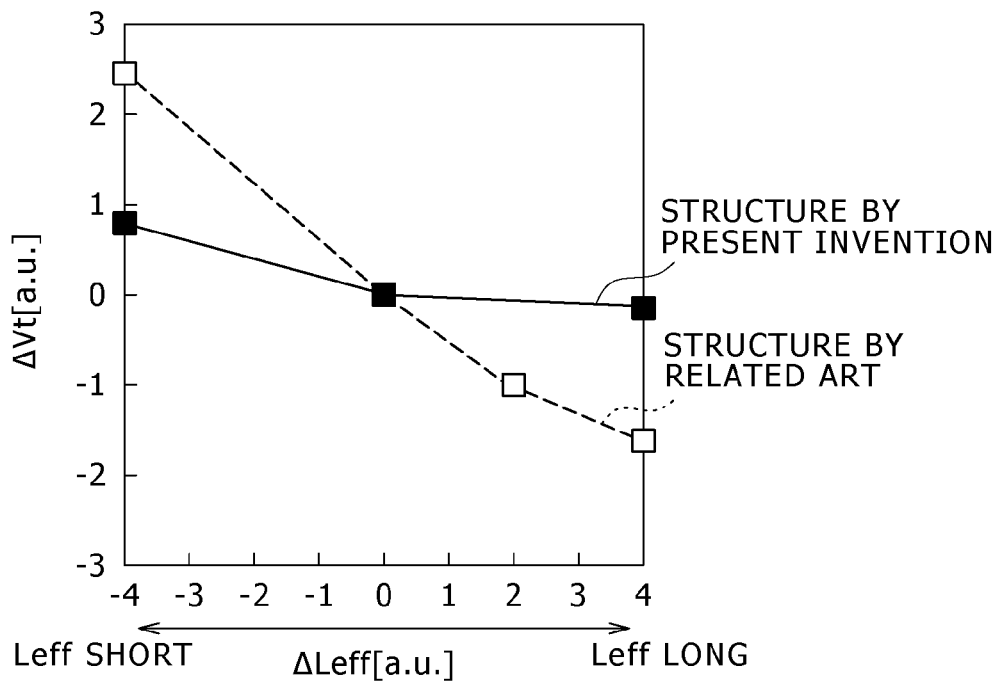
ΔLeff: VARIATION IN Leff WITH REFERENCE TO 0 POINT ON x-AXIS
ΔVt: VARIATION IN Vt WITH REFERENCE TO 1 POINT ON y-AXIS
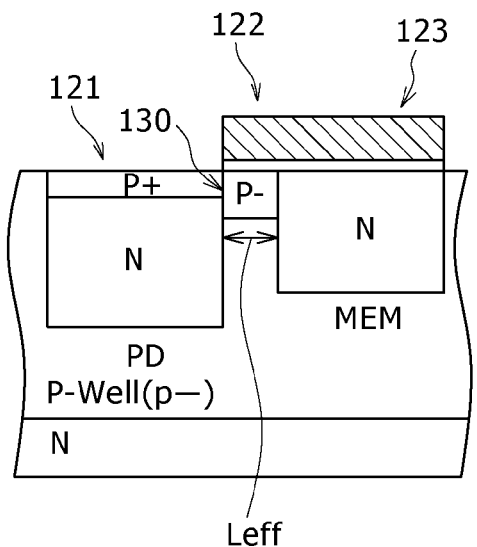

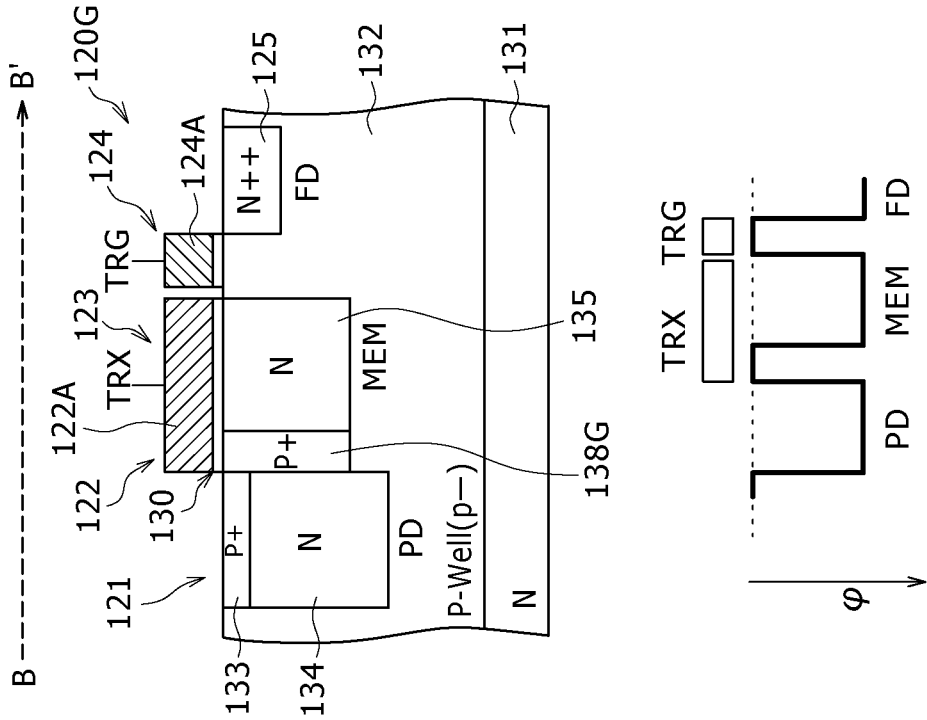
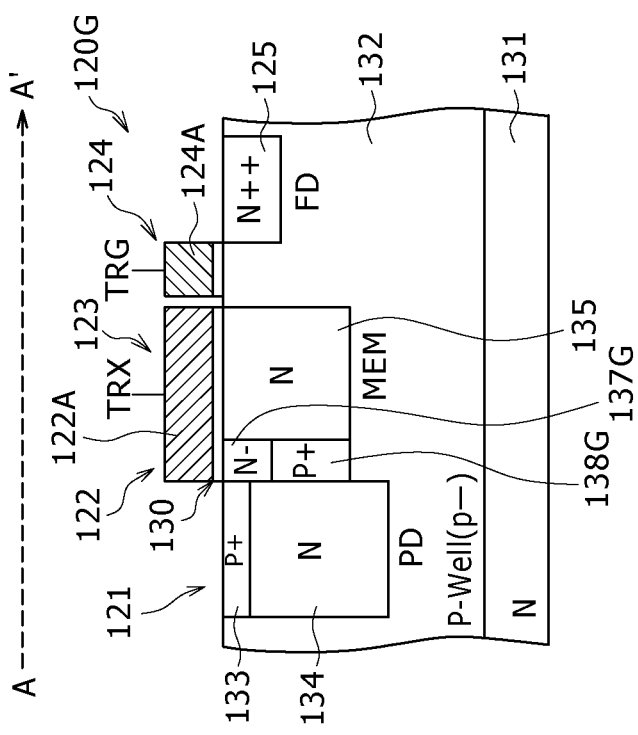

SOLID-STATE IMAGING DEVICE, METHOD OF MANUFACTURING SOLID-STATE IMAGING DEVICE, AND ELECTRONIC APPARATUS

BACKGROUND OF THE INVENTION

1. Field of the Invention

The present invention relates to a solid-state imaging device, a method of manufacturing a solid-state imaging device, and an electronic apparatus. In particular, the invention relates to a solid-state imaging device, a method of manufacturing the solid-state imaging device, and an electronic apparatus using the solid-state imaging device by which images with high quality can be obtained.

2. Description of the Related Art

Solid-state imaging devices have been incorporated in various electronic apparatuses, for example, imaging apparatuses such as digital still cameras, video cameras, etc. and mobile terminal apparatuses having an imaging function, for a variety of uses. The solid-state imaging devices include APS (active pixel sensor) having amplifying elements on a pixel basis, and CMOS (complementary MOS) image sensors in which signal charges accumulated in photodiodes provided as photoelectric conversion elements are read out through MOS (metal oxide semiconductor) transistors are in wide use.

A unit pixel in a CMOS image sensor according to the related art has, for example, a photodiode having an HAD (Hole Accumulated Diode) structure and an FD (Floating Diffusion) region disposed on the opposite sides of the photodiode with respect to a transfer gate. In addition to these components, the unit pixel has a reset transistor, a selecting transistor, and an amplifying transistor.

In a CMOS image sensor, in general, a readout operation of reading out the signal charge accumulated in each photodiode is carried out on the basis of each row in a pixel array, and the pixels for which the readout operation is finished restart accumulation of electric charge at the moment the readout operation is finished. Since the readout operation is thus performed on the basis of each line in the pixel array, in the CMOS image sensor, the signal charge accumulation periods cannot be made coincident for all the pixels. In the case where the subject to be imaged is moving or in other similar situations, therefore, the image obtained would be distorted. For instance, when a subject which is straight shaped in the vertical direction and which is moving horizontally is shot, the subject is imaged as if it were inclined.

In order to obviate the generation of such a distortion of image, there has been developed an all-pixel-simultaneous electronic shutter for CMOS image sensor such as to realize the same exposure period for all the pixels. The all-pixel-simultaneous electronic shutter is a shutter ensuring that exposure is started simultaneously and finished simultaneously for all the pixels effective for imaging, and such a system is also called global shutter (global exposure).

As a method for realizing the global shutter in a CMOS image sensor, for example, there is a method in which an electric-charge holding region is provided between the photodiode and the FD region in each pixel. Where each pixel is provided with the electric-charge holding region, the area of the photodiode is restricted, whereby the saturated electric-charge amount is reduced, as compared with that in a pixel structured without the electric-charge holding region.

In view of the foregoing, the present applicant has proposed a pixel structure in which a photodiode and a electric-charge holding region are integrally united together through an overflow path, in order to obviate a reduction in the maximum electric charge amount of a photodiode (see, for example, Japanese Patent Laid-open No. 2009-268083, hereinafter referred to as Patent Document 1).

SUMMARY OF THE INVENTION

However, in the CMOS image sensor of the structure described in Patent Document 1, the potential barrier of the overflow path between the photodiode and the electric-charge holding region may be easily varied by variations in the impurity concentration arising from scattering results of production. Particularly, it becomes more difficult to control variations in impurity concentration as the pixel size is reduced and the pixel structure becomes finer.

Specifically, in the structure of the overflow path described in Patent Document 1, the potential barrier of the overflow path is determined by a single impurity layer, and, at the time of realizing a predetermined potential barrier, it is difficult to control the potential in a region on the lower side of (in a region separate in the depth direction from) the overflow path. Therefore, in the region on the lower side of the overflow path, the potential would be varied under influences of the photodiode and the electric-charge holding region which are present on both sides thereof.

Especially, in the case where the area of each unit pixel is reduced attendant on the reduction of chip size of the CMOS image sensor, the potential in the region on the lower side of the overflow path becomes more susceptible to influences of the photodiode and the electric-charge holding region, whereby the potential may vary more. With the region on the lower side of the overflow path thus influenced by the photodiode and the electric-charge holding region, a punch-through phenomenon due to a short channel effect becomes more liable to occur, and it becomes difficult to accumulate a predetermined signal charge stably in the photodiode.

Where the predetermined signal charge cannot be stably accumulated in the photodiode, as above-mentioned, the quality of images picked up would be lowered. Thus, there is a need for suppressing the variations of potential in the region on the lower side of the overflow path in each pixel possessed by a solid-state imaging device, and thereby enhancing the quality of images picked up.

Thus, there is a desire to obtain images with enhanced image quality.

According to one embodiment of the present invention, there is provided a solid-state imaging device including: a semiconductor region of a second conductivity type which is formed on a face side of a semiconductor substrate; a photoelectric conversion element which has an impurity region of a first conductivity type and which is operable to generate electric charge according to the amount of incident light and to accumulate the electric charge in the inside thereof; an electric-charge holding region which has an impurity region of the first conductivity type and in which the electric charge generated through photoelectric conversion by the photoelectric conversion element is held until read out; an intermediate transfer path which has an impurity region of the first conductivity type disposed in a region between the photoelectric conversion element and the electric-charge holding region and through which only the electric charge generated by the photoelectric conversion element during an exposure period and being in excess of a predetermined electric charge amount is transferred into the electric-charge holding region; and an impurity layer having an impurity region of the second conductivity type which is disposed in a region between the photoelectric conversion element and the electric-charge holding region and under the intermediate transfer path and which is higher in impurity concentration than the semiconductor region of the second conductivity type.

According to another embodiment of the present invention, there is provided a method of manufacturing a solid-state imaging device, including the steps of: forming a photoelectric conversion element which has an impurity region of a first conductivity type and which is operable to generate electric charge according to the amount of incident light and to accumulate the electric charge in the inside thereof; forming an electric-charge holding region which has an impurity region of the first conductivity type and in which the electric charge generated through photoelectric conversion by the photoelectric conversion element is held until read out; forming an intermediate transfer path which has an impurity region of the first conductivity type disposed in a region between the photoelectric conversion element and the electric-charge holding region and through which only the electric charge generated by the photoelectric conversion element during an exposure period and being in excess of a predetermined electric charge amount is transferred into the electric-charge holding region; and forming an impurity layer having an impurity region of the second conductivity type which is disposed in a region between the photoelectric conversion element and the electric-charge holding region and under the intermediate transfer path and which is higher in impurity concentration than the semiconductor region of the second conductivity type formed on a face side of a semiconductor substrate.

According to a further embodiment of the present invention, there is provided an electronic apparatus including a solid-state imaging device, the solid-state imaging device including: a semiconductor region of a second conductivity type which is formed on a face side of a semiconductor substrate; a photoelectric conversion element which has an impurity region of a first conductivity type and which is operable to generate electric charge according to the amount of incident light and to accumulate the electric charge in the inside thereof; an electric-charge holding region which has an impurity region of the first conductivity type and in which the electric charge generated through photoelectric conversion by the photoelectric conversion element is held until read out; an intermediate transfer path which has an impurity region of the first conductivity type disposed in a region between the photoelectric conversion element and the electric-charge holding region and through which only the electric charge generated by the photoelectric conversion element during an exposure period and being in excess of a predetermined electric charge amount is transferred into the electric-charge holding region; and an impurity layer having an impurity region of the second conductivity type which is disposed in a region between the photoelectric conversion element and the electric-charge holding region and under the intermediate transfer path and which is higher in impurity concentration than the semiconductor region of the second conductivity type; wherein of unit pixels arranged in a matrix pattern, the unit pixels in a plurality of rows perform the electric-charge accumulation simultaneously, and the electric charges transferred from the photoelectric conversion elements into the electric-charge holding regions are read out sequentially.

According to the above-described embodiments of the present invention, there is provided an impurity layer having an impurity region of a second conductivity type which is disposed in the region between a photoelectric conversion element and an electric-charge holding region and on the lower side of an intermediate transfer path and which is higher in impurity concentration than a semiconductor region of the second conductivity type formed on the face side of a semiconductor substrate.

According to the above-described embodiments of the present invention, images with high image quality can be obtained and a solid-state imaging device capable of producing images with high quality can be manufactured.

BRIEF DESCRIPTION OF THE DRAWINGS

FIG. 5 illustrates a method of manufacturing the unit pixel;

FIG. 8 illustrates the effect in the unit pixel;

FIGS. 15A and 15B illustrate sectional views and potential states of a unit pixel according to a seventh embodiment;

DETAILED DESCRIPTION OF THE PREFERRED EMBODIMENTS

Figure 1:
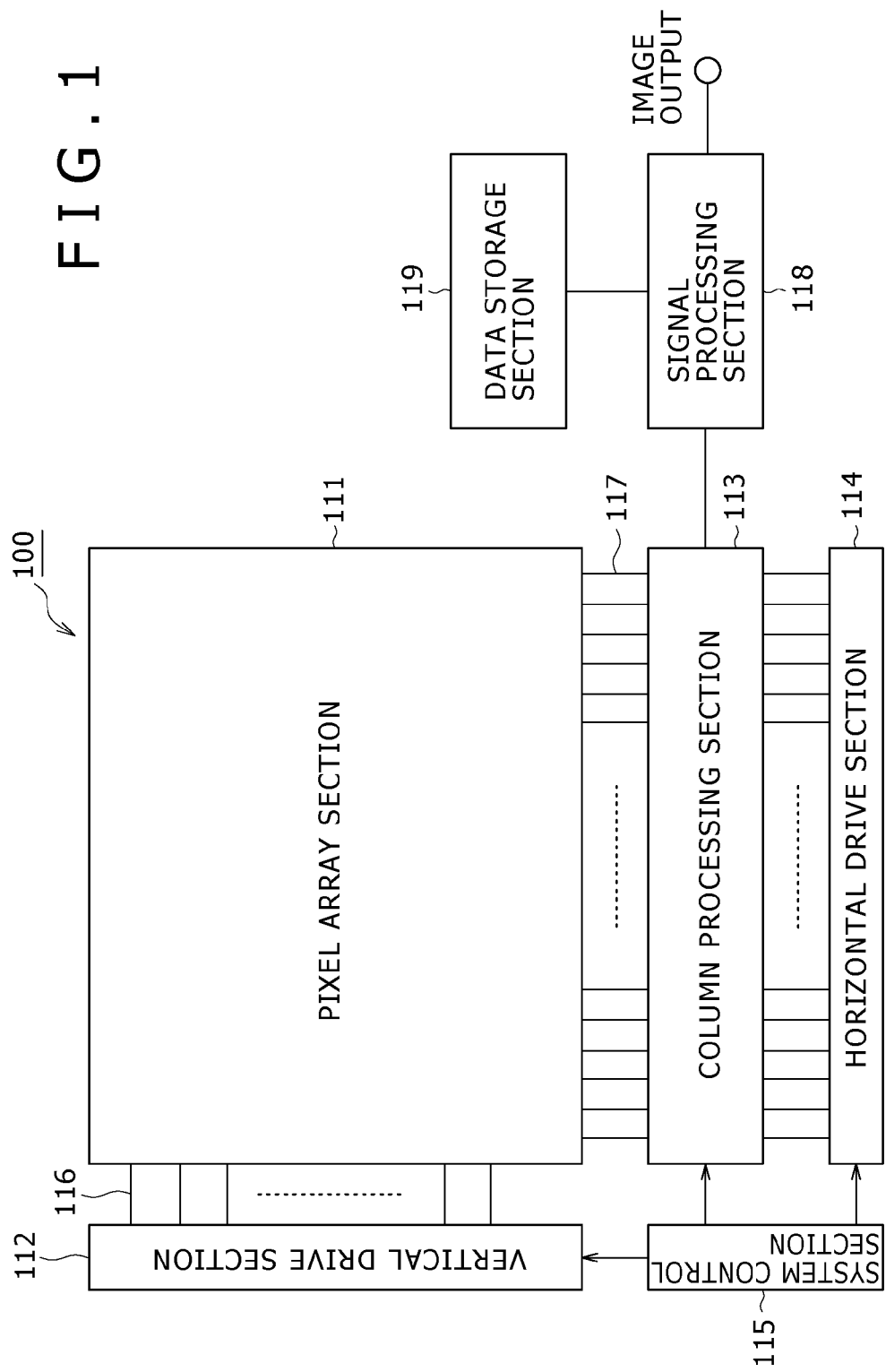
FIG. 1 is a block diagram showing a configuration example of an embodiment of the solid-state imaging device to which an embodiment of the present invention is applied.

Now, specific embodiments of the present invention will be described in detail below referring to the drawings.

FIG. 1 is a block diagram showing a configuration example of an embodiment of the solid-state imaging device to which the present invention is applied.

[Configuration Example of Solid-state Imaging Device]

FIG. 1 is a block diagram showing a configuration example of a CMOS image sensor as a solid-state imaging device to which the present invention is applied.

A CMOS image sensor 100 includes a pixel array section 111, a vertical drive section 112, a column processing section 113, a horizontal drive section 114, and a system control section 115. The pixel array section 111, the vertical drive section 122, the column processing section 113, the horizontal drive section 114, and the system control section 115 are formed on a semiconductor substrate (chip) which is not shown in the figure.

In the pixel array section 111, unit pixels (for example, unit pixels 120A in FIG. 2) each having a photoelectric conversion element operable to generate light electric charge in an electric charge amount corresponding to the amount of incident light and to accumulate the light electric charge therein are two-dimensionally arranged in a matrix form. Incidentally, in the following description, the light electric charge in an electric charge amount corresponding to the amount of incident light will sometimes be referred to simply as "electric charge," and the unit pixel as "pixel."

In the pixel array section 111, further, pixel drive lines 116 are formed along the left-right direction in the figure (the arrangement direction of pixels in the pixel row) for each row in the matrix-formed pixel arrangement, and vertical signal lines 117 are formed along the vertical direction in the figure (the arrangement direction of pixels in the pixel column) for each column in the matrix-formed pixel arrangement. While each pixel drive line 116 is composed of one line in FIG. 1, the number of the lines constituting each pixel drive line 116 is not limited to one. One end of each pixel drive line 116 is connected to an output terminal corresponding to each row, in the vertical drive section 112.

The CMOS image sensor 100, further, includes a signal processing section 118 and a data storage section 119. The signal processing section 118 and the data storage section 119 may execute processing by external signal processing sections, for example, digital signal processors (DSPs) or software provided on a substrate different from that of the CMOS image sensor 100, or may be mounted on the same substrate as that of the CMOS image sensor 100.

The vertical drive section 112 has a shift register or an address decoder or the like, and is a pixel drive section by which the pixels in the pixel array section 111 are driven all pixels simultaneously or one row at a time or in the like manner. The vertical drive section 112, of which the specific configuration is omitted in the figure, generally has two scanning systems, that is, a readout scanning system and a sweep scanning system.

The readout scanning system performs sequential selective scanning of the unit pixels in the pixel array section 111 one row at a time, for reading out signals from the unit pixels. The sweep scanning system performs sweep scanning of the readout row subjected to the readout scanning by the readout scanning system, the sweep scanning being precedent to the readout scanning by a period of time corresponding to shutter speed.

As a result of the sweep scanning by the sweep scanning system, unrequired electric charges are swept out of the photoelectric conversion elements in the unit pixels in the readout row (the photoelectric conversion elements are reset). Besides, as a result of the sweeping-out of the unrequired electric charges (resetting) by the sweep scanning system, a so-called electronic shutter operation is carried out. Here, the electronic shutter operation means an operation of discarding the light electric charges present in the photoelectric conversion elements and newly starting exposure to light (starting accumulation of light electric charge).

A signal read out by the readout operation by the readout scanning system corresponds to the amount of light having been incident after the immediately preceding readout operation or electronic shutter operation. Then, the period of time from the readout timing of the immediately preceding readout operation or the sweep-out timing of the immediately preceding electronic shutter operation to the readout timing of the current-time readout operation becomes an accumulation time (exposure time) for light electric charge in the unit pixel.

Pixel signals outputted from each of the unit pixels in the pixel row having undergone the selective scanning by the vertical drive section 112 are supplied to the column processing section 113 through each of the vertical signal lines 117.

The column processing section 113 applies a predetermined signal processing to the pixel signals outputted from each of the unit pixels in the selected row through the vertical signal lines 117, on the basis of each pixel column in the pixel array sections 111, and temporarily holds the pixel signals obtained upon the signal processing.

Specifically, the column processing section 113 performs at least a noise removing processing, for example, a correlated double sampling (CDS) processing as the signal processing. As a result of the CDS processing by the column processing section 113, fixed pattern noises intrinsic to pixel such as reset noises, scattering of threshold of amplifying transistors, etc. are removed. The column processing section 113 may be provided not only with the function for the noise removing processing but also, for example, an AD (analog-to-digital) converting function, so as to output the signal level in the form of a digital signal.

The horizontal drive section 114 has a shift register or an address decoder or the like, and sequentially selects unit circuits corresponding to the pixel columns, in the column processing section 113. As a result of the selective scanning by the horizontal drive section 114, pixel signals having undergone the signal processing in the column processing section 113 are sequentially outputted to the signal processing section 118.

The system control section 115 has, for example, a timing generator operable to generate a variety of timing signals, and performs drive control on the vertical drive section 112, the column processing section 113 and the horizontal drive section 114, etc. based on the various timing signals generated by the timing generator.

The signal processing section 118 has at least a function for addition processing, and applies various signal processings such as addition processing to the pixel signals outputted from the column processing section 113. The data storage section 119 temporarily stores data required for the signal processings performed in the signal processing section 118.

[Structure of Unit Pixel]

Now, the specific structure of the unit pixels 120A arranged in a matrix pattern in the pixel array section 111 will be described below. The unit pixel 120A has, other than a floating diffusion region (capacitance), an electric charge holding region (hereinafter referred to as the "memory part") for holding a light electric charge transferred from the photoelectric conversion element.

Figure 2:
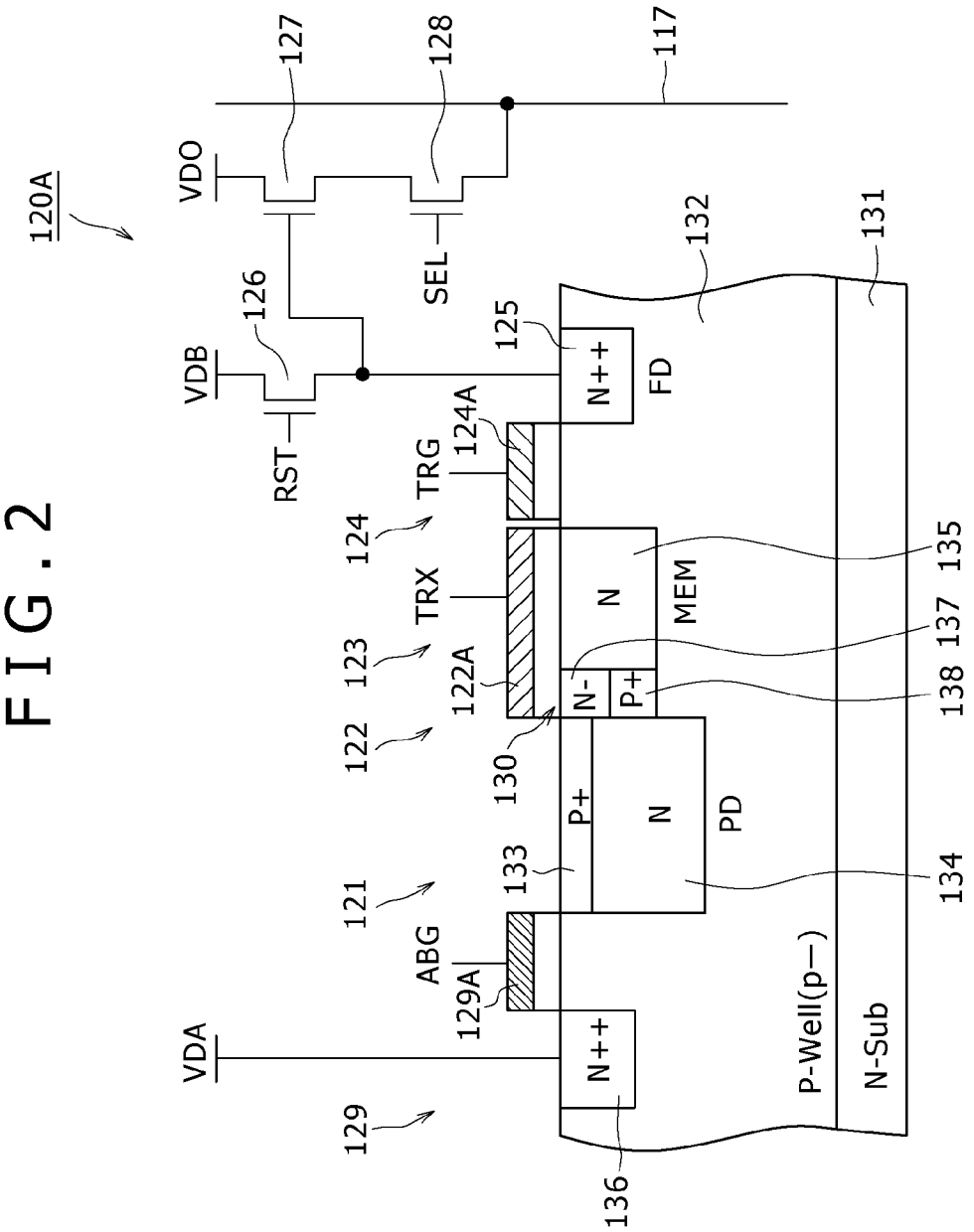
FIG. 2 illustrates the configuration of a unit pixel which is a first embodiment.

FIG. 2 illustrates the structure of the unit pixel 120A.

The unit pixel 120A has, for example, a photodiode (PD) 121 as the photoelectric conversion element. The photodiode 121 is, for example, a buried-type photodiode formed by a method in which, in a P-type well layer 132 formed in an N-type substrate 131, a P-type layer 133 (P+) is formed on the substrate surface side so as to bury an N-type buried layer 134 (N). In this embodiment, the N type is taken as a first conductivity type, and the P type as a second conductivity type.

The unit pixel 120A has a first transfer gate 122, a memory part (MEM) 123, a second transfer gate 124 and a floating diffusion region (FD) 125, in addition to the photodiode 121. Incidentally, the unit pixel 120A is shielded from light by a light-blocking film (not shown) by which other portions than an opening portion for guiding light to the photodiode 121, contact portions of each transistor, etc. are shielded from light.

The first transfer gate 122, upon application of a transfer pulse TRX to a gate electrode 122A, transfers the electric charge generated through photoelectric conversion in the photodiode 121 and accumulated in the photodiode 121. In addition, in the first transfer gate 122, specifically at a boundary portion between the photodiode 121 and the memory part 123 on the lower side of the gate electrode 122A, an N− impurity diffusion region 137 is provided, whereby an overflow path 130 is formed. Further, beneath the impurity diffusion region 137, there is provided a concentrated P+ impurity diffusion region 138 (a P-type impurity layer higher in impurity concentration than the P-type well layer 132) of the conductivity type opposite to the conductivity type of the impurity diffusion region 137. Incidentally, the impurity diffusion regions 137 and 138 will be described later referring to FIGS. 3A to 4C.

The memory part 123 has an N-type buried channel 135 (N) formed under the gate electrode 122A, and holds the electric charge transferred from the photodiode 121 by the first transfer gate 122. With the memory part 123 having the buried channel 135, generation of dark current at the substrate interface can be restrained, which contributes to enhancement of image quality.

In the memory part 123, the gate electrode 122A is disposed at an upper portion thereof, and it is possible to apply modulation to the memory part 123 by impressing a transfer pulse TRX on the gate electrode 122A. Specifically, with the transfer pulse TRX applied to the gate electrode 122A, the potential of the memory part 123 is made to be deeper. As a result, the amount of saturated electric charge in the memory part 123 can be increased, as compared with that in the absence of the modulation.

The second transfer gate 124, upon application of a transfer pulse TRG to a gate electrode 124A, transfers the electric charge held in the memory part 123. The floating diffusion region 125 is a charge-to-voltage conversion part having an N-type layer (N++), and converts the electric charge transferred from the memory part 123 by the second transfer gate 124 into a voltage.

The unit pixel 120A further has a reset transistor 126, an amplifying transistor 127 and a selecting transistor 128. In the example shown in FIG. 2, N-channel MOS transistors are used as the reset transistor 126, the amplifying transistor 127 and the selecting transistor 128. However, the combination of conductivity types of the reset transistor 126, the amplifying transistor 127 and the selecting transistor 128 shown in FIG. 2 is merely an example, and the combination is not limitative.

The reset transistor 126 is connected between a power supply VDB and the floating diffusion region 125, and resets the floating diffusion region 125 when a reset pulse RST is applied to its gate electrode. The amplifying transistor 127 has a drain electrode connected to a power supply VDO, has a gate electrode connected to the floating diffusion region 125, and reads out a voltage of the floating diffusion region 125.

The selecting transistor 128, for example, has a drain electrode connected to a source electrode of the amplifying transistor 127, and has a source electrode connected to the vertical signal line 117. When a selecting pulse SEL is applied to its gate electrode, the selecting transistor 128 selects a unit pixel 120A from which a pixel signal is to be read out. Incidentally, a configuration may be adopted in which the selecting transistor 128 is connected between the power supply VDO and the drain electrode of the amplifying transistor 127.

Of the reset transistor 126, the amplifying transistor 127 and the selecting transistor 128, one or more may be omitted depending on a pixel signal reading method, or may be shared by a plurality of pixels.

The unit pixel 120A, furthermore, has an electric-charge discharging part 129 for discharging the electric charge accumulated in the photodiode 121. When a control pulse ABG is applied to a gate electrode 129A at the time of start of exposure, the electric-charge discharging part 129 discharges the electric charge in the photodiode 121 to a drain part 136 (N++) having an N-type layer. Further, the electric-charge discharging part 129 functions to prevent overflow of electric charge from occurring due to saturation of the photodiode 121 during a readout period after completion of exposure. A predetermined voltage is applied to the drain part 136.

[Potential of Gate Electrode of Memory Part 123]

Here, the potential of the gate electrode at the memory part 123 serving as the electric-charge holding region, namely, the gate electrode 122A of the first transfer gate 122, will be described.

In this embodiment, the potential of the gate electrode at the memory part 123 serving as the electric-charge holding region is set at a potential such as to secure a pinning state during when at least either one of the first transfer gate 122 and the second transfer gate 124, for example, the first transfer gate 122 is put in a non-conduction state.

More specifically, the voltage impressed on the gate electrodes 122A, 124A at the time of putting either one or both of the first transfer gate 122 and the second transfer gate 124 into the non-conduction state is so set as to secure a pinning state in which carriers of the polarity opposite to that of light electric charge can be accumulated at the Si surface beneath the gate electrode.

In the case where the transistor constituting the transfer gate is of the N type as in this embodiment, the voltage impressed on the gate electrode 122A at the time of putting the first transfer gate 122 into the non-conduction state is set at a voltage which is more negative in potential than the ground GND, relative to the P-type well layer 132. Incidentally, though not shown, in the case where the transistor constituting the transfer gate is of the P type, the P-type well layer in the above description is replaced by an N-type well layer, and the voltage in consideration is set at a higher voltage than the power supply voltage VDD relative to the N-type well layer.

The voltage impressed on the gate electrode 122A at the time of putting the first transfer gate 122 into the non-conduction state is thus set at a voltage such as to secure a pinning state in which carriers of the polarity opposite to that of light electric charge can be accumulated at the Si surface beneath the gate electrode, for the following reason.

When the potential of the gate electrode 122A of the first transfer gate 122 is set at the same potential (for example, 0 V) as the P-type well layer 132, carriers generated from crystal defects at the Si surface are accumulated in the memory part 123, and may become a dark current, leading to a lower image quality. In view of this, in the present embodiment, the OFF potential of the gate electrode 122A formed over the memory part 123 is set at a negative potential, e.g. −2.0 V, relative to the P-type well layer 132. This ensures that, in the present embodiment, holes can be generated at the Si surface of the memory part 123 during the electric-charge holding period, and electrons generated at the Si surface can be put into recombination. As a result, the dark current can be reduced.

Incidentally, in the configuration shown in FIG. 2, the gate electrode 124A of the second transfer gate 124 is present at an end portion of the memory part 123. Therefore, by setting the gate electrode 124A also at a negative potential, a dark current generated at the end portion of the memory part 123 can similarly be suppressed. In addition, while a configuration example in which an N-type substrate is used will be described in each of the embodiments below, a P-type substrate may also be used. In that case, for example, the N-type substrate 131 and the P-type well layer 132 in the configuration example shown in FIG. 2 are each composed of a P-type semiconductor region.

In the CMOS image sensor 100, exposure is started simultaneously for all the pixels, the exposure is finished simultaneously for all the pixels, and the electric charge accumulated in the photodiode 121 is sequentially transferred to the memory part 123 (shielded from light) and the floating diffusion region 125, whereby global exposure is realized. The global exposure ensures that the exposure period is the same for all the pixels, whereby distortionless imaging can be realized.

Incidentally, "all the pixels" in this embodiment means all of the pixels in the portions appearing in the image, exclusive of dummy pixels and the like. Besides, if the time differences and image distortions are so small as not to produce any problem, an operation conducted simultaneously for all the pixels may be replaced by an operation based on high-speed scanning of a plurality of rows (e.g., several tens of rows) at a time. In addition, the present invention is applicable also to the case where global exposure is conducted for pixels in plural rows in a predetermined region, instead of all the pixels in the portions appearing in the image.

[First Embodiment]

Now, the configuration of unit pixels 120A in a first embodiment will be described below referring to FIGS. 3A to 4C. In FIGS. 3A to 4C and in the following drawings, the same components as those in the unit pixel of FIG. 2 above will be denoted by the same reference symbols as used above, and detailed descriptions of them will be omitted.

Figure 3A:
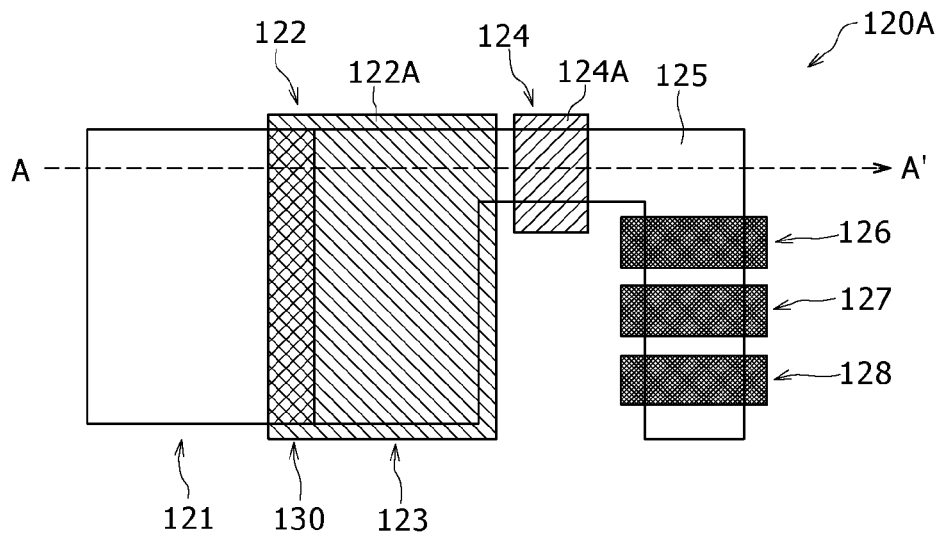
FIGS. 3A and 3B are respectively a plan view and a sectional view showing the configuration of a unit pixel which is the first embodiment.
Figure 3B:
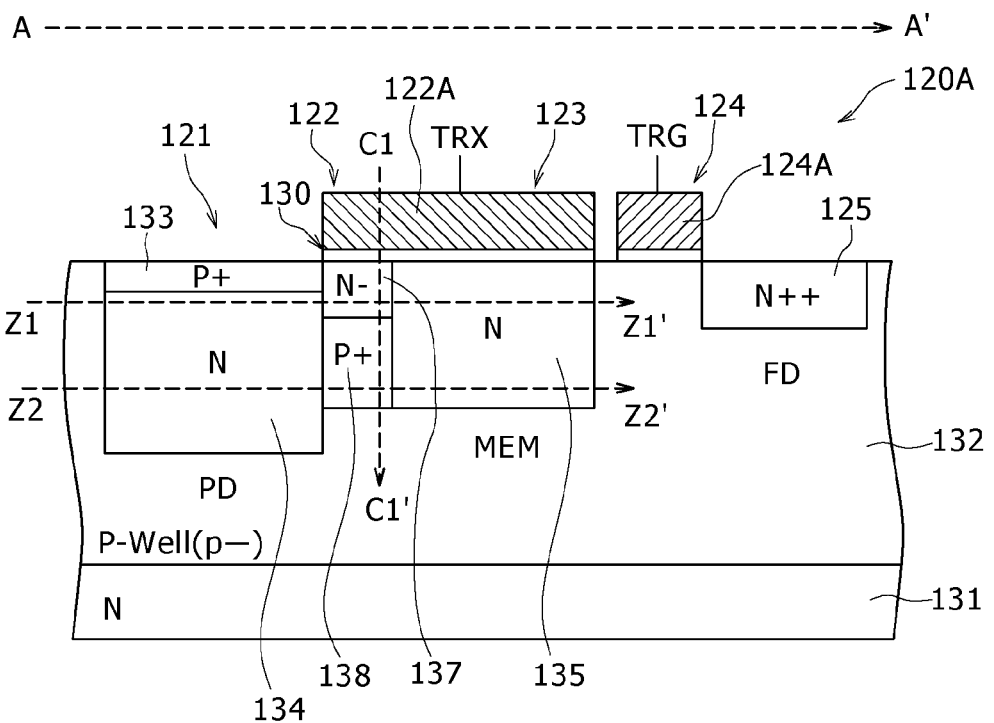

FIG. 3A is a plan view showing the configuration of the unit pixel 120A, and FIG. 3B is a sectional view of the unit pixel 120A along line A-A' in the plan view of FIG. 3A.

As shown in FIGS. 3A and 3B, a photodiode 121, a memory part 123, and a floating diffusion region 125 are disposed in the unit pixel 120A. The photodiode 121 and the memory part 123 are formed to have such an impurity concentration that a depletion state is obtained upon discharging of electric charge. The floating diffusion region 125 is formed to have an impurity concentration such as to permit electrical connection therewith of a wiring contact for taking out a voltage.

Besides, in the unit pixel 120A, a first transfer gate 122 is provided between the photodiode 121 and the memory part 123, and a second transfer gate 124 is provided between the memory part 123 and the floating diffusion region 125. In addition, a gate electrode 122A is so provided as to cover the first transfer gate 122 and the memory part 123, and a gate electrode 124A is so provided as to cover the second transfer gate 124.

In the unit pixel 120A, in a region where the first transfer gate 122 formed at the boundary portion between the photodiode 121 and the memory part 123 is provided, there is formed an overflow path 130 through which a signal charge in excess of a predetermined amount is automatically discharged from the photodiode 121 into the memory part 123. Here, it is assumed that a negative voltage necessary for holes to be accumulated on a silicon surface on the lower side of the gate electrode 122A of the first transfer gate 122 is impressed on the gate electrode 122A.

As shown in FIG. 3B, in the unit pixel 120A, on the surface side of the boundary portion between the photodiode 121 and the memory part 123 on the lower side of the gate electrode 122A, there is provided an N− impurity diffusion region 137 of the same conductivity type as the impurity (N) constituting the photodiode 121 and the memory part 123, whereby the overflow path 130 is formed. Further, in the unit pixel 120A, a concentrated P+ impurity diffusion region 138 of the conductivity type opposite to that of the impurity diffusion region 137 is provided beneath the impurity diffusion region 137.

More specifically, a P-type well layer 132 is formed on an N-type substrate 131, and the photodiode 121 is of the HAD (Hole Accumulated Diode) structure. The impurity concentration of an N-type buried layer 134 constituting the photodiode 121 is, for example, about $10^{16}$ to $10^{18}$ cm$^{-3}$, and the impurity concentration of a P-type layer 133 formed at the surface of the photodiode 121 is, for example, about $10^{17}$ to $10^{18}$ cm$^{-3}$. In addition, the impurity concentration of an N-type buried channel 135 constituting the memory part 123 is about $10^{16}$ to $10^{18}$ cm$^{-3}$, like the N-type buried layer 134 of the photodiode 121.

Besides, the impurity diffusion region 137 constituting the overflow path 130 is set to be shallower in junction depth and lower in impurity concentration than the N-type buried channel 135 constituting the memory part 123. In addition, the impurity diffusion region 138 provided on the lower side of the overflow path 130 is formed to have such an impurity concentration as not to be put into a depletion state by intrusion of potentials of the photodiode 121 and the memory part 123 in the condition where signal charge is accumulated in the photodiode 121 and the memory part 123. For instance, the impurity diffusion region 138 is formed to have an impurity concentration of about $10^{17}$ to $10^{18}$ cm$^{-3}$. Besides, the depth of the impurity diffusion region 138 is set to be a depth from a position beneath the impurity diffusion region 137 down at least to the lower end of the N-type buried channel 135 constituting the memory part 123.

Figure 4A:
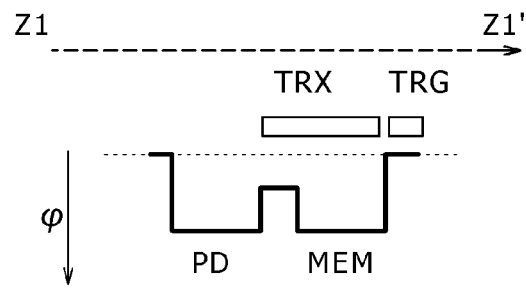
FIGS. 4A to 4C each illustrate a potential state.
Figure 4B:
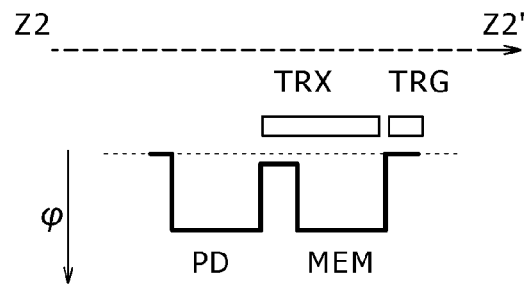
Figure 4C:
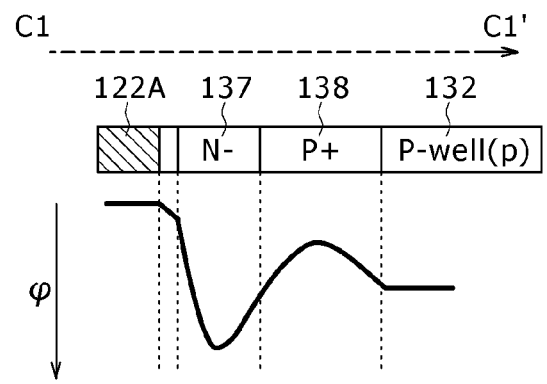

The potential state of the overflow path 130 configured as above will be described referring to FIGS. 4A to 4C. FIGS. 4A to 4C respectively show a potential state along line Z1-Z1' of FIG. 3B, a potential state along line Z2-Z2' of FIG. 3B, and a potential state along line C1-C1' of FIG. 3B.

As shown in FIG. 4A, the potential barrier is lowered in a region where the impurity diffusion region 137 is provided [in a region between the photodiode (PD) and the memory part (MEM)]. In addition, as shown in FIG. 4B, the potential barrier is such as to offer a non-conduction state in the region of the impurity diffusion region 138 provided beneath the impurity diffusion region 137.

The potential state in a section along the depth direction of the overflow path 130 is shown in FIG. 4C. As shown in FIG. 4C, a minimum (lowest) point of potential barrier to electrons is formed in the impurity diffusion region 137, and a maximum (highest) point of potential barrier to electrons is formed in the impurity diffusion region 138.

Thus, the configuration in which the impurity diffusion region 138 is provided makes it possible to enhance the potential. Therefore, even when the transfer path of the overflow path 130 is reduced attendant on the refining (miniaturization) of the size of the unit pixel 120A, the potential barrier necessary for overflow of electric charge in excess of a predetermined amount from the photodiode 121 into the memory part 123 can be formed. Besides, it is possible to prevent a punch-through phenomenon which would otherwise arise from connection of depletion layers on the lower side of the overflow path 130 between the photodiode 121 and the memory part 123.

Here, in solid-state imaging devices represented by the CMOS image sensor, in general, light absorption wavelength is present as a physical constant which is irrelevant to scaling; therefore, in order to maintain spectral sensitivity characteristics in silicon, the junction depth of the N-type layer in the photodiode cannot be made shallower. As a result, it has been difficult to change the design rule while suppressing the short channel effect, according to the constant-electric-field scaling rule which is used for ordinary MOSFET (MOS Field Effect Transistor). This holds true also in the structure disclosed in the above-mentioned Patent Document 1. Especially, in the case where the depth of the N-type layer in the memory part is deeper than the floating diffusion region to increase the saturated electric-charge amount capable of being held by the memory part, the punch-through phenomenon caused by the short channel effect is liable to occur at the time of miniaturization. Meanwhile, it may be considered that the short channel effect might be obviated by extending the effective horizontal distance between the photodiode and the memory part. However, the distance should be designed to be short, in order to maximize the saturated electric-charge amounts in the photodiode and the memory part.

In the unit pixel 120A, on the other hand, the overflow path 130 can be stably formed, without increasing the effective horizontal distance between the photodiode 121 and the memory part 123. This ensures that the predetermined signal charge can be stably accumulated in the photodiode 121. Consequently, a lowering in the quality of images picked up can be obviated, and images with high quality can be obtained.

Incidentally, in the example shown in FIGS. 3A and 3B, there is adopted a structure in which the overflow path 130 is formed by providing the N− impurity diffusion region 137. However, a structure may be adopted in which the overflow path 130 is formed by providing a P− impurity diffusion region 137, instead of providing the N− impurity diffusion region 137.

[Method of Producing Unit Pixel 120A]

Now, a method of producing the unit pixel 120A will be described below, referring to FIG. 5.

In a first step, a resist 160-1 opened in a region corresponding to the first transfer gate 122 is formed on a surface of a substrate provided with a P-type well layer 132, and P-type ion implantation is conducted using the resist 160-1, to form an impurity diffusion region 138 at a position to be located at a predetermined depth.

In a second step, using the resist 160-1, N-type ion implantation is conducted, to form an impurity diffusion region 137 in a region of depth ranging from the upper surface of the impurity diffusion region 138 up to the substrate surface.

Next, after the resist 160-1 is removed, a third step is carried out in which resist 160-2 opened in a region corresponding to a memory part 123 is formed, and N-type ion implantation is carried out using the resist 160-2, to form a buried channel 135. As a result, the memory part 123 is formed.

Subsequently, after the resist 160-2 is removed, a fourth step is conducted in which a resist 160-3 opened in a region corresponding to a photodiode 121 is formed, and N-type ion implantation is carried out using the resist 160-3, to form an N-type buried layer 134.

In a fifth step, P-type ion implantation is conducted using the resist 160-3, to form a P-type layer 133 at the surface of the N-type buried layer 134. As a result, an HAD-type photodiode 121 is formed.

In a sixth step, the resist 160-3 is removed, a gate oxide film is formed by, for example, a thermal oxidation method, followed by depositing polysilicon by a CVD (Chemical Vapor Deposition) method, to form a gate electrode 122A.

By a method including the above-mentioned steps, the unit pixel 120A is produced. Incidentally, a treatment for forming the gate electrode 122A may be conducted before the treatment for forming the N-type buried layer 134 is carried out, in the fourth step. In other words, after the sixth step is conducted to form the gate electrode 122A, the fourth and fifth steps may be formed to form the photodiode 121.

[Second Embodiment]

Figure 6:
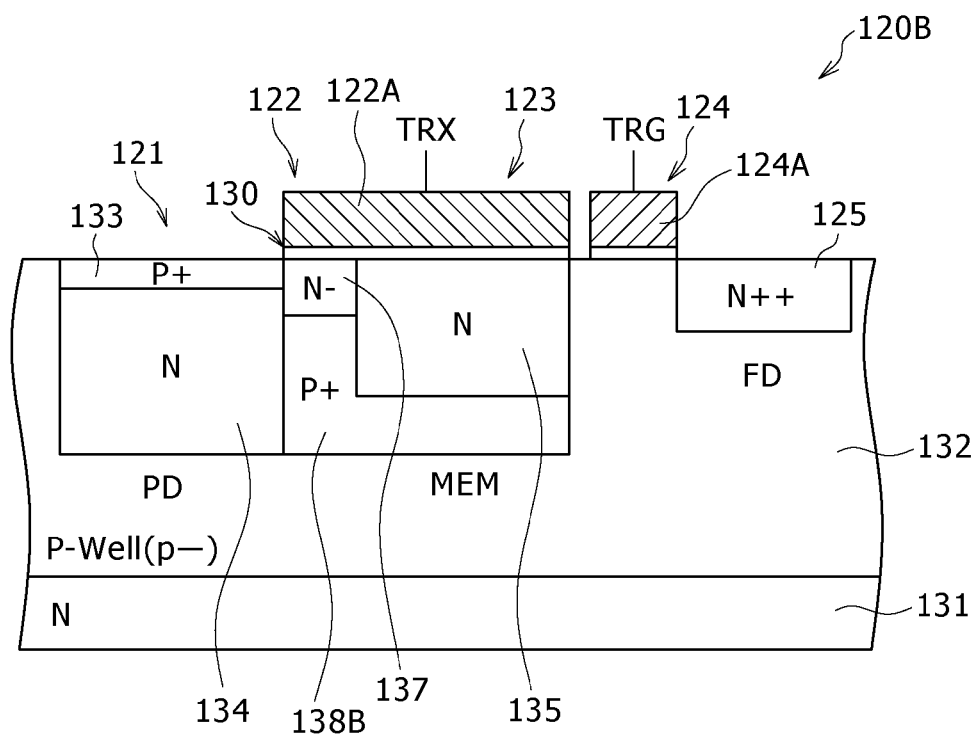
FIG. 6 is a sectional view of a unit pixel according to a second embodiment.

FIG. 6 shows a sectional view of a unit pixel 120B according to a second embodiment.

As shown in FIG. 6, in the unit pixel 120B, an impurity diffusion region 138B formed on the lower side of an impurity diffusion region 137 which becomes an overflow path 130 is so formed as to extend to the lower side (the substrate depth side) of a part or a whole part of a buried channel 135 constituting a memory part 123. In other words, the impurity diffusion region 138 is formed to be L-shaped in section shown in FIG. 6.

With the impurity diffusion region 138B thus extending to the lower side of the buried channel 135, a potential barrier similar to that between the N-type buried layer 134 and the buried channel 135 is formed also on the lower side of the memory part 123. As a result, the punch-through phenomenon which would take place between the N-type buried layer 134 and the buried channel 135 in the unit pixel 120B can be prevented from occurring. In addition, it is possible to prevent an unintended transfer path from being formed due to connection of depletion layers in a region ranging from a lower portion of the memory part 123 to the photodiode 121.

Further, in the unit pixel 120B, it is possible to prevent a situation in which an electric charge generated by photoelectric conversion of light incident on a P-well layer 132 in a region deeper than the memory part 123 mixes into the memory part 123 without passing through the overflow path 130.

Here, referring to FIGS. 7A and 7B and FIG. 8, an effect in the unit pixel 120B will be described in comparison with a unit pixel of a structure according to the related art.

Figure 7A:
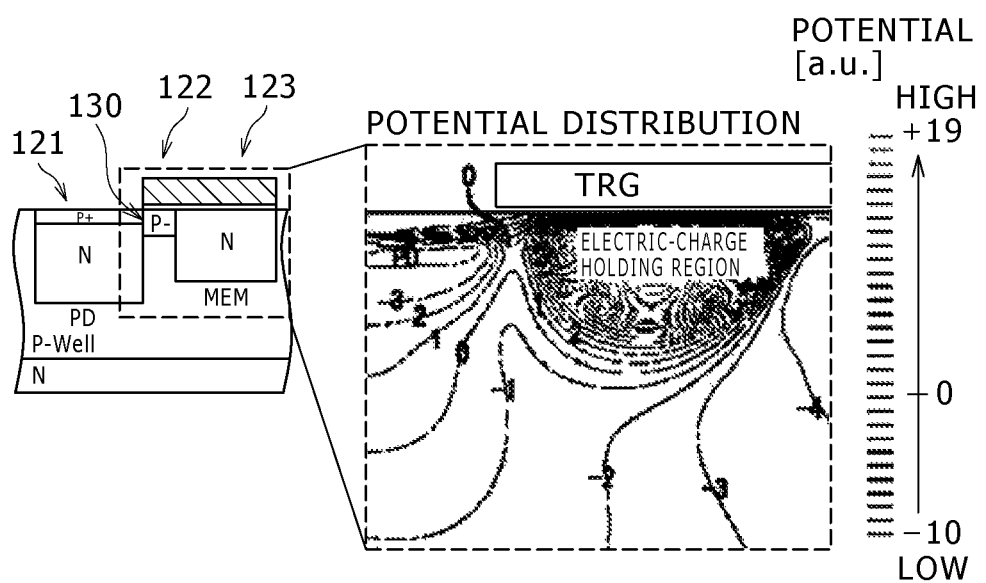
FIGS. 7A and 7B illustrate an effect in a unit pixel.

FIG. 7A shows a potential distribution in a unit pixel of a structure according to the related art in which a first transfer gate 122 is provided with an impurity diffusion region 137 but not provided with an impurity diffusion region 138 (for example, the same structure as in FIG. 20 of the above-mentioned Patent Document 1). FIG. 7B shows a potential distribution in the unit pixel 120B shown in FIG. 6. Besides, it is assumed that the photodiode 121 and the memory part 123 are set at positive potentials, while the first transfer gate 122 is set at a negative potential.

In the unit pixel of the structure by the related art, the region on the lower side of the overflow path 130 composed of the P-type impurity diffusion region 137 remains as the P-type well layer 132, so that the potential barrier in the region is susceptible to influences of the photodiode 121 and the memory part 123. Specifically, as shown in the potential state in FIG. 7A, the potential barrier to electrons is low on the lower side of the region (overflow path 130) surrounded by the contour line of 0 which is present at the boundary between the photodiode 121 and the memory part 123. As a result, the depletion layers in the photodiode 121 and the memory part 123 are liable to be connected to each other, so that a punch-through phenomenon is liable to occur in the region between the photodiode 121 and the memory part 123. Incidentally, the same holds true also in the case where the overflow path 130 is composed of an N-type impurity diffusion region.

Figure 7B:
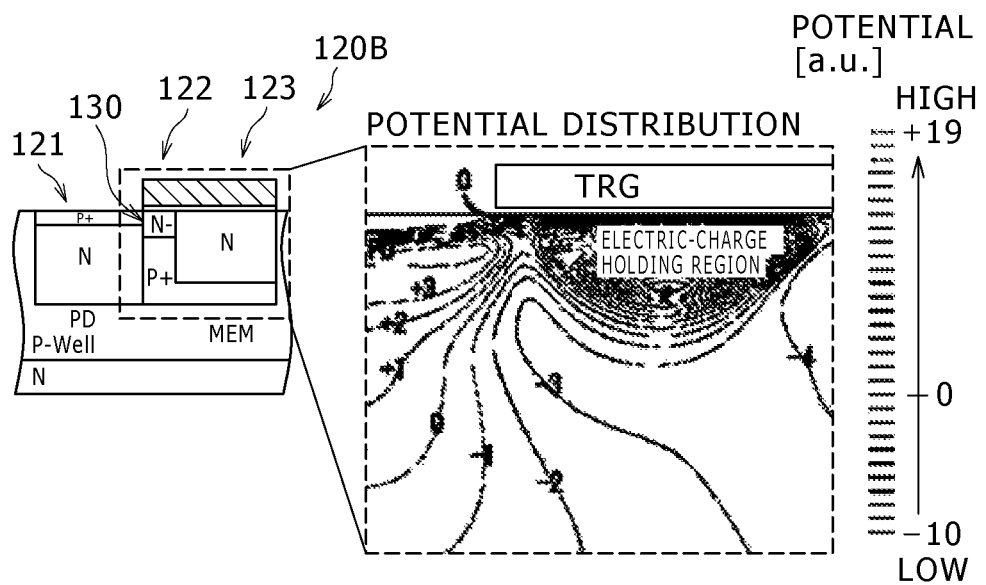

On the other hand, in the unit pixel 120B, as shown in FIG. 7B, the potential barrier on the lower side of the overflow path 130 is fixed at a high value to electrons. Therefore, in the unit pixel 120B, intrusion of potential from the photodiode 121 and the memory part 123 can be prevented.

FIG. 8 shows the results of simulation of variations in threshold voltage (Vt) in the case where the transfer path length (Leff) of the overflow path 130 is varied, for the unit pixel of a structure according to the related art shown in FIG. 7A and the unit pixel 120B (the structure according to an embodiment of the present invention) shown in FIG. 7B.

Here, as shown at the lower side in FIG. 8, the transfer path length of the overflow path 130 is the length of the overflow path 130 between the photodiode 121 and the memory part 123. In addition, the threshold voltage is the threshold voltage between the photodiode 121 and the memory part 123. In FIG. 8, y-axis represents that the potential barrier to electrons becomes lower as one goes along the positive direction and that the potential barrier to electrons becomes higher as one goes along the negative direction.

As shown in FIG. 8, in the unit pixel 120B (the structure by the present invention), the potential on the lower side of the overflow path 130 is not liable to be varied, which means that the unit pixel 120B has a structure durable to the short channel effect. In addition, it is seen that variations (ΔVt) in threshold with variations (ΔLeff) in transfer path length is suppressed in the unit pixel 120B. Therefore, the unit pixel 120B is of a structure which is rigid to variations in transfer path length arising from scattering results of manufacture or the like.

[Third Embodiment]

Figure 9:
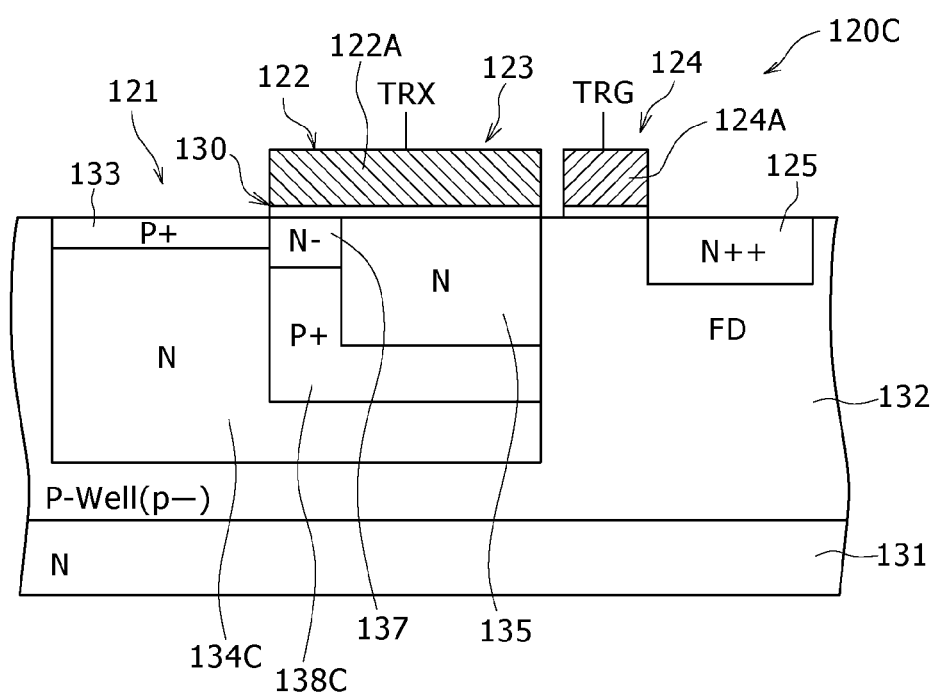
FIG. 9 is a sectional view of a unit pixel according to a third embodiment.

FIG. 9 is a sectional view of a unit pixel 120C according to a third embodiment.

As shown in FIG. 9, in the unit pixel 120C, an impurity diffusion region 138C formed on the lower side of an impurity diffusion region 137 which becomes an overflow path 130 is extending to the lower side of a buried channel 135 constituting a memory part 123, like in the impurity diffusion region 138B of FIG. 6. Further, in the unit pixel 120C, an N-type buried layer 134C constituting a photodiode 121 is formed so as to extend to the lower side of the impurity diffusion region 138C. In other words, the impurity diffusion region 138C and the N-type buried layer 134C are formed to be L-shaped in section shown in FIG. 9.

With the N-type buried layer 134C thus extending to the lower side of the buried channel 135, formation of the overflow path 130 can be stabilized. Further, the electric charge generated through photoelectric conversion by light incident on a P-type well layer 132 in a region deeper than the memory part 123 is entirely collected into the photodiode 121, so that such electric charge can be prevented from mixing into other region (for example, the buried channel 135) than the photodiode 121.

[Fourth Embodiment]

Figure 10:
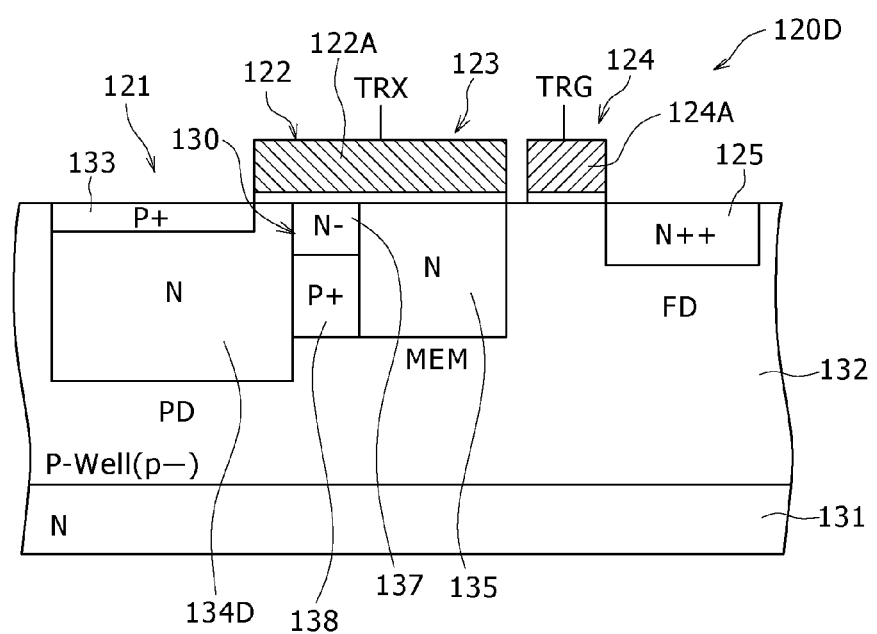
FIG. 10 is a sectional view of a unit pixel according to a fourth embodiment.

FIG. 10 is a sectional view of a unit pixel 120D according to a fourth embodiment.

As shown in FIG. 10, in the unit pixel 120D, part of an N-type buried layer 134D constituting a photodiode 121 is so formed as to overlap with (specifically, directly underlies) a first transfer gate 122 in plan view.

With the N-type buried layer 134D thus formed, at the time of completely transferring the signal charge accumulated in the photodiode 121 into a memory part 123, the voltage to be impressed on a gate electrode 122A of the transfer gate 122 necessary for the transferring operation can be reduced. Specifically, since the N-type buried layer 134D corresponds to a source region of a MOS transistor in relation to the first transfer gate 122, the overlap of the part of the N-type buried layer 134D with the first transfer gate 122 ensures that a complete transfer path at the time of a complete transfer operation can be easily formed. As a result, the voltage necessary for formation of the complete transfer path can be reduced.

[Fifth Embodiment]

Figure 11:
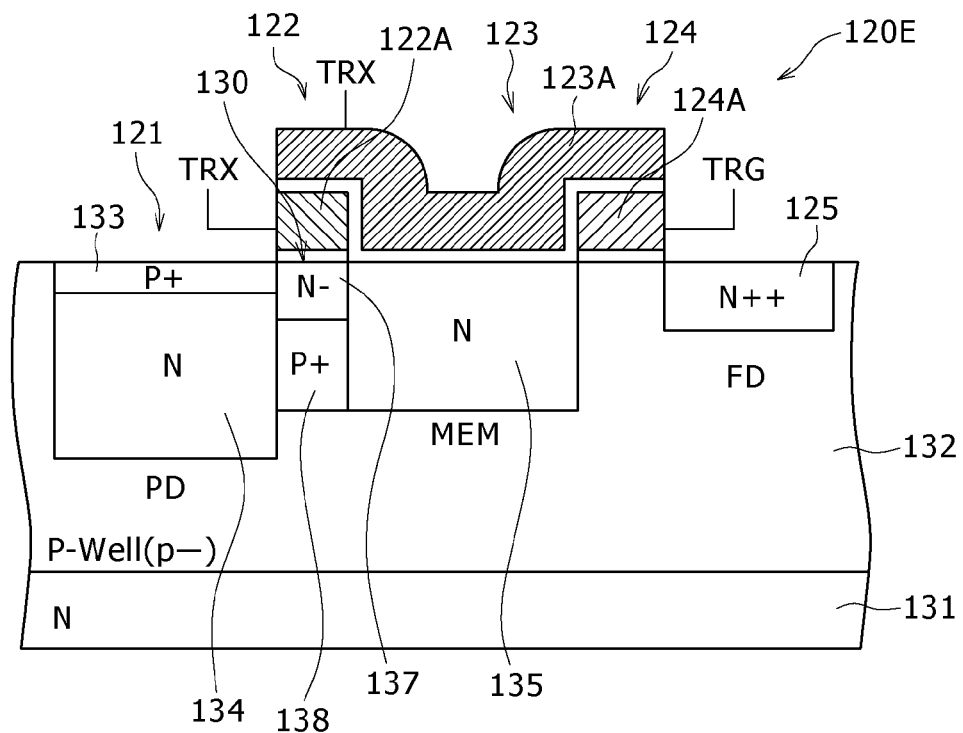
FIG. 11 is a sectional view of a unit pixel according to a fifth embodiment.

FIG. 11 is a sectional view of a unit pixel 120E according to a fifth embodiment.

As shown in FIG. 11, in the unit pixel 120E, a gate electrode 123A covering a memory part 123 is formed separately from a gate electrode 122A covering an overflow path 130. With a transfer pulse TRY impressed on the gate electrode 123A, the potential of the memory part 123 is made deeper. Further, the gate electrode 123A is formed of a metal high in light-blocking property, for example, tungsten, as a material in charge of shielding the memory part 123 from light. In other words, the gate electrode 123A has both the function as a transfer gate for transferring electric charge to the memory part 123 and the function to shield the memory part 123 from light.

[Sixth Embodiment]

Figure 12:
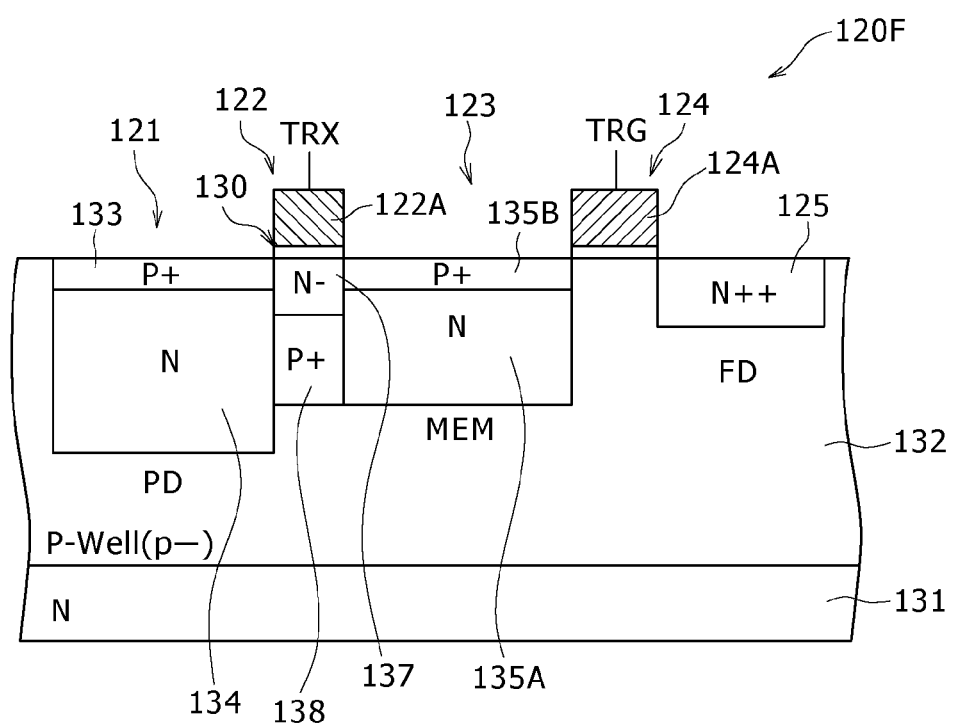
FIG. 12 is a sectional view of a unit pixel according to a sixth embodiment.

FIG. 12 is a sectional view of a unit pixel 120F according to a sixth embodiment.

As shown in FIG. 12, in the unit pixel 120F, a gate electrode is not provided on the upper side of a memory part 123, but the impurity structure of the memory part 123 is an HAD structure, like in a photodiode 121. Specifically, in the unit pixel 120F, the memory part 123 is composed of an N-type buried channel 135A formed in a P-type well layer 132, and a P-type layer 135B (P+) formed on the surface side of the buried channel 135A. In addition, a gate electrode 122A of a first transfer gate 122 is formed on the surface of a region between the photodiode 121 and the memory part 123.

In the unit pixel 120F thus configured, a P-type layer 133 and an N-type buried layer 134 which constitute the photodiode 121 and the buried channel 135A and the P-type layer 135B which constitute the memory part 123 can be formed in a self-aligned manner relative to the gate electrode 122A of the first transfer gate 122.

[Method of Producing Unit Pixel 120F]

Figure 13:
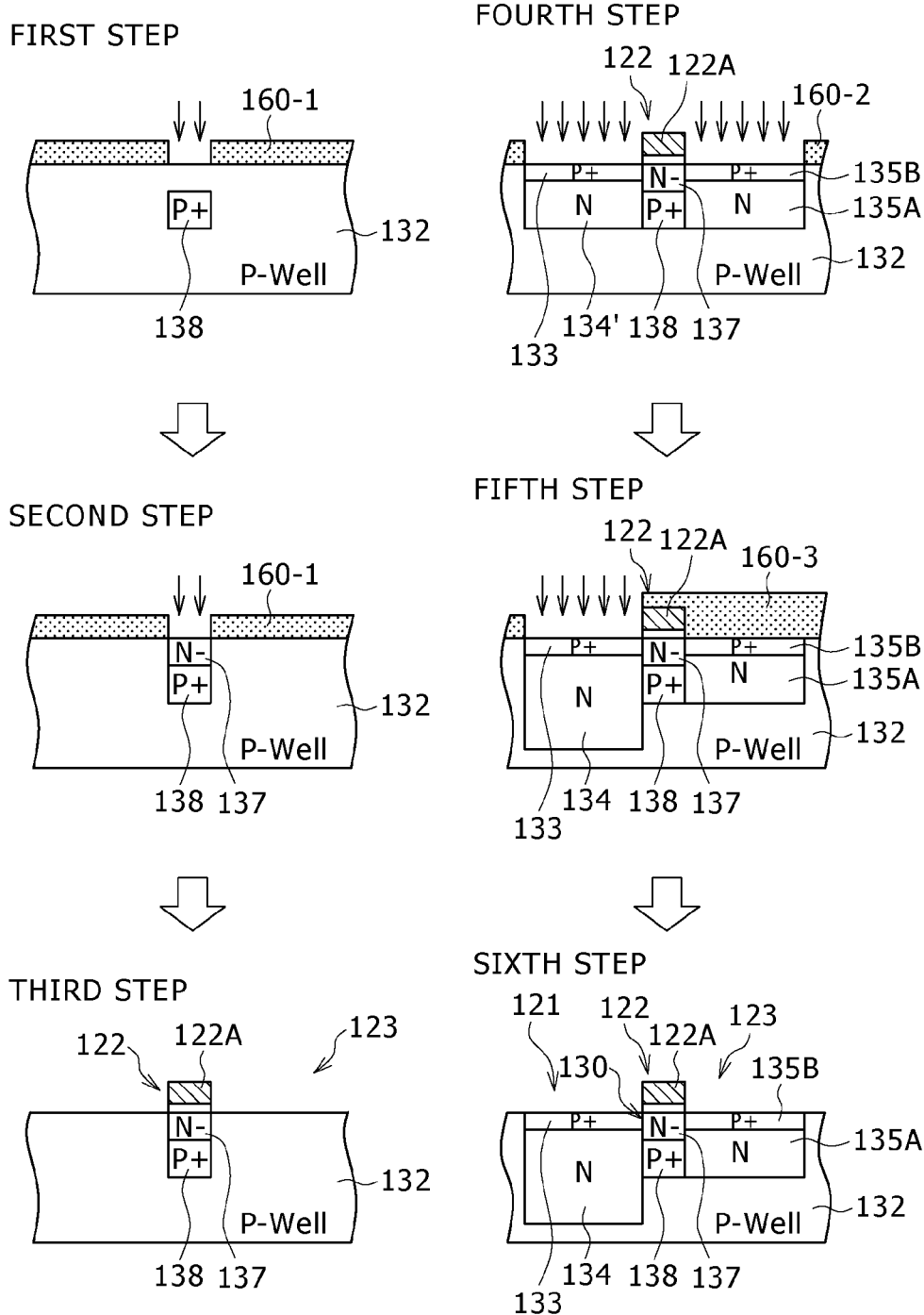
FIG. 13 illustrates a method of producing a unit pixel.

Now, a method of producing the unit pixel 120F will be described below referring to FIG. 13.

In first and second steps, impurity diffusion regions 137 and 138 are formed, in the same manner as in the producing method shown in FIG. 5. Then, in a third step, a gate oxide film is formed by, for example, a thermal oxidation method, and thereafter polysilicon is deposited by a CVD method, to form a gate electrode 122A on the surface of the impurity diffusion region 137, whereby a first transfer gate 122 is provided.

In a fourth step, a resist 160-2 is formed in a region other than the regions where to form a photodiode 121 and a memory part 123 and the region of the gate electrode 122A, and N-type ion implantation is conducted using the resist 160-2. As a result, a buried channel 135A and an N-type buried layer 134' for constituting part of an N-type buried layer 134 are formed. Thereafter, P-type ion implantation is carried out using the resist 160-2, whereby a P-type layer 133 and a P-type layer 135B are formed.

In a fifth step, a resist 160-3 in the shape of covering the P-type layer 135 is formed, and N-type ion implantation is conducted using the resist 160-3. As a result, an N-type layer is formed on the lower side of the N-type buried layer 134', whereby an N-type buried layer 134 is formed. Incidentally, the fifth step can be omitted if it is unnecessary to make the depth of the photodiode 121 deeper than the memory part 123.

Thereafter, in a sixth step, the resist 160-3 is removed.

By a method including the above-mentioned steps, the unit pixel 120F is produced. In the production method, the boundaries between the gate electrode 122A and both the photodiode 121 and the memory part 123 coincide assuredly with end portions of the gate electrode 122A, since the gate electrode 122A is used as a mask in ion plantations for formation of the photodiode 121 and the memory part 123. In other words, the photodiode 121 and the memory part 123 can be formed in a self-aligned manner relative to the end portions of the gate electrode 122A.

[Seventh Embodiment]

Figure 14:
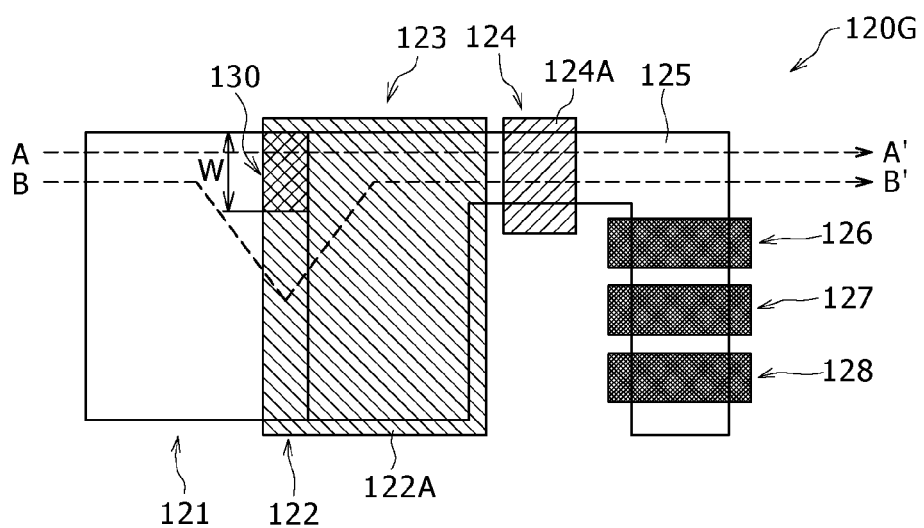
FIG. 14 is a plane view of a unit pixel according to a seventh embodiment.

Now, referring to FIG. 14 and FIGS. 15A and 15B, a unit pixel 120G according to a seventh embodiment will be described below. FIG. 14 shows a plan view of the unit pixel 120G, FIG. 15A shows a sectional view along line A-A' in the plan view of FIG. 14 and a potential state relevant thereto, and FIG. 15B shows a sectional view along line B-B' in the plan view of FIG. 14 and a potential state relevant thereto.

As shown in FIG. 14, in the unit pixel 120G, an overflow path 130 is formed in the region of part of a first transfer gate 122 in plan view. In other words, in the unit pixel 120G, a transfer path (the overflow path 130) through which an electric charge accumulated in a photodiode 121 and being in excess of a predetermined electric charge amount is transferred into a memory part 123 and a transfer path through which the electric charge accumulated in the photodiode 121 is completely transferred into the memory part 123 are formed in different regions.

The configuration in which the overflow path 130 is thus formed in the region of part of the first transfer gate 122 ensures that the amount of electric charge let flow over from the photodiode 121 into the memory part 123 can be regulated by the setting of the width of the region in which the overflow path 130 is formed (the width W shown in FIG. 14).

Incidentally, though not shown in the drawings, in this embodiment, a light-blocking film is disposed on the substrate surface in order to prevent incident light from entering the memory part 123 or into a floating diffusion region 125. The light-blocking film is formed of such a material as tungsten, and is preferably provided so as to cover at least upper portions of the memory part 123 and the floating diffusion region 125.

Incidentally, while the above embodiments have been described by taking as an example an image sensor in which signal charge is electron, the present invention is also applicable to an image sensor of the type in which signal charge is hole. Specifically, even in the case where the N-type layers and the P-type layers in regard of the conductivity type of the impurity layers as above-mentioned are reversed and where the photodiode and the memory part are provided by forming P-type impurity layers in an N-type semiconductor layer, the same effect as above-mentioned can be obtained, by reading the N− or P+ type of the conductivity type of the impurity diffusion region 137 constituting the overflow path 130 in each of the above-mentioned configurations as P− or N+ type.

In addition, while the impurity concentrations of the impurity layers and the like have been described using numerical values as above, these numerical values are not absolute values but merely illustrative of the technical thought of the present invention. Thus, the criteria of the present invention can be set without being limited by the numerical values used in the above description.

Incidentally, while the above embodiments have been described by taking as an example an image sensor in which the signal charge is electron, the present invention is applicable also to image sensors of the type in which the signal charge is hole.

[Other First Configuration Example of Unit Pixel]

Figure 16:
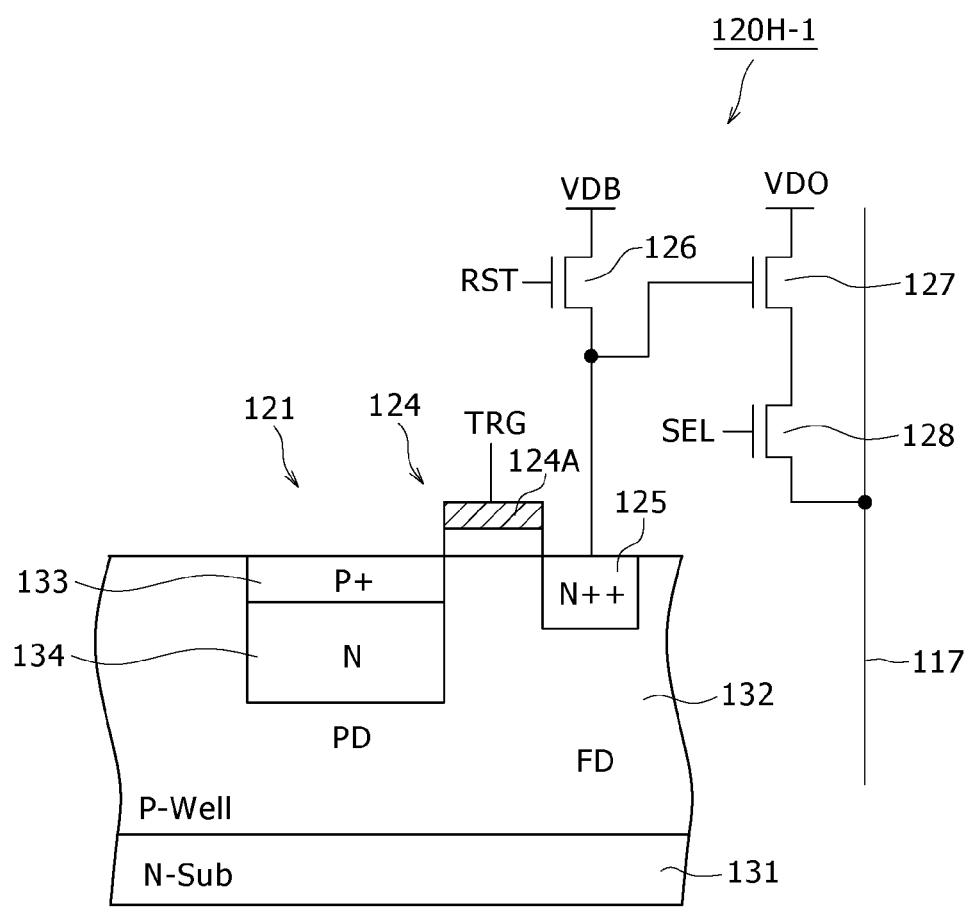
FIG. 16 illustrates the structure of an other first configuration example of the unit pixel.

FIG. 16 illustrates the structure of a unit pixel 120H-1 which is other first configuration example of the unit pixel 120.

In the unit pixel 120H-1, the first transfer gate 122 and the memory part 123 in the unit pixel 120A of FIG. 2 are omitted, and a photodiode 121 and a floating diffusion region 125 are disposed to be adjacent to each other, with a P-type well layer 132 therebetween. On the upper side of the P-type well layer 132 between the photodiode 121 and the floating diffusion region 125, there is disposed a second transfer gate 124.

A global exposure operation in the unit pixel 120H-1 will now be described. First, an electric-charge discharging operation by which discharging of accumulated electric charge from the buried photodiode 121 is conducted simultaneously for all the pixels is carried out, and thereafter exposure to light is started. As a result, light electric charge is accumulated in a PN junction capacitance of the photodiode 121. At the end of the exposure period, turning ON of the second transfer gate 124 is conducted simultaneously for all the pixels, whereby the light electric charge accumulated is entirely transferred into the floating diffusion region 125. The second transfer gate 124 is closed, whereby the light electric charge having been accumulated during the exposure period which is the same for all the pixels is held in the floating diffusion region 125. Thereafter, the light electric charges held in the floating diffusion regions 125 are sequentially read out through vertical signal lines 117 as image signals. Finally, the floating diffusion region 125 is reset, and thereafter the reset level is read out.

Therefore, in the unit pixel 120H-1, the floating diffusion region 125 becomes an electric charge holding region in the case of performing the global exposure operation. In the unit pixel 120H-1, the present invention is applicable by adopting a method in which an overflow path 130 is provided by forming an impurity diffusion region 137 at a second transfer gate 124 at a boundary portion between the photodiode 121 and the floating diffusion region 125, and an impurity diffusion region 138 is provided beneath the impurity diffusion region 137.

[Other Second Configuration Example of Unit Pixel]

Figure 17:
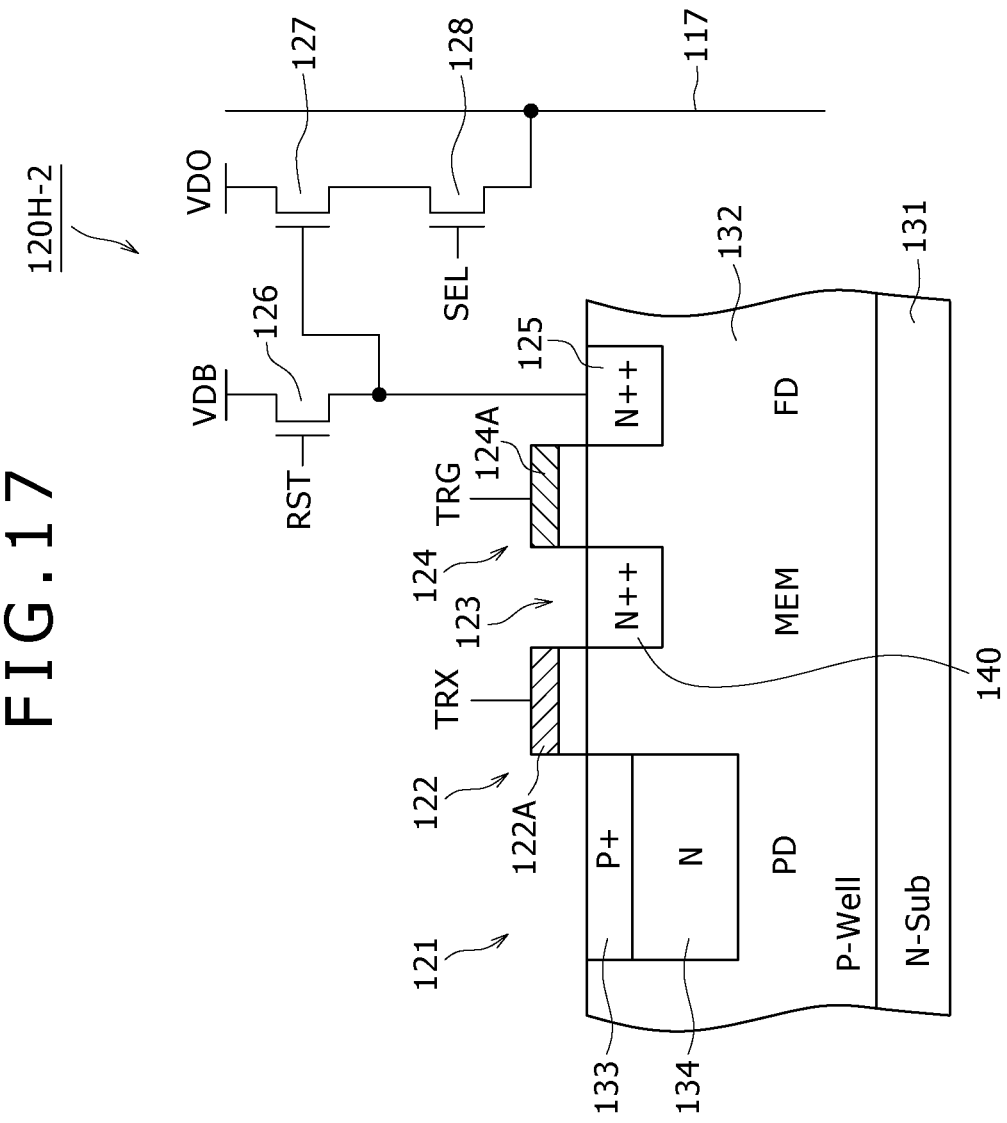
FIG. 17 illustrates the structure of an other second configuration example of the unit pixel.

FIG. 17 illustrates the structure of a unit pixel 120H-2 which is other second configuration example of the unit pixel 120.

The unit pixel 120H-2 has a configuration in which a memory part 123 similar to the floating diffusion region 125 is added to the configuration of the unit pixel 120A of FIG. 2. Specifically, in the unit pixel 120H-2, a gate electrode 122A of a first transfer gate 122 is provided at an upper portion of a P-type well layer 132 at the boundary between a photodiode 121 and the memory part 123. Besides, in the unit pixel 120H-2, the memory part 123 has an N-type layer 138 similar to the floating diffusion region 125.

A global exposure operation in the unit pixel 120H-2 is conducted in the following procedure. First, an electric-charge discharging operation is carried out simultaneously for all the pixels, whereby simultaneous exposure to light is started. Light electric charge thus generated is accumulated in the photodiode 121. At the end of the exposure, turning ON of the first transfer gate 122 is performed simultaneously for all the pixels, and the light electric charge accumulated is transferred into the memory part 123, to be held there. After the exposure is finished, a reset level and a signal level are read out by a sequential operation. Specifically, the floating diffusion region 125 is reset, and then the reset level is read out. Subsequently, the electric charge held in the memory part 123 is transferred into the floating diffusion region 125, and the signal level is read out.

In the unit pixel 120H-2, the N-type region 138 of the memory part 123 becomes an electric-charge holding region in the case of performing the global exposure operation. In the unit pixel 120H-2, the present invention can be applied by a method in which an overflow path 130 is provided by forming an impurity diffusion region 137 at the first transfer gate 122, and the impurity diffusion region 138 is provided beneath the impurity diffusion region 137.

[Other Third Configuration Example of Unit Pixel]

Figure 18:
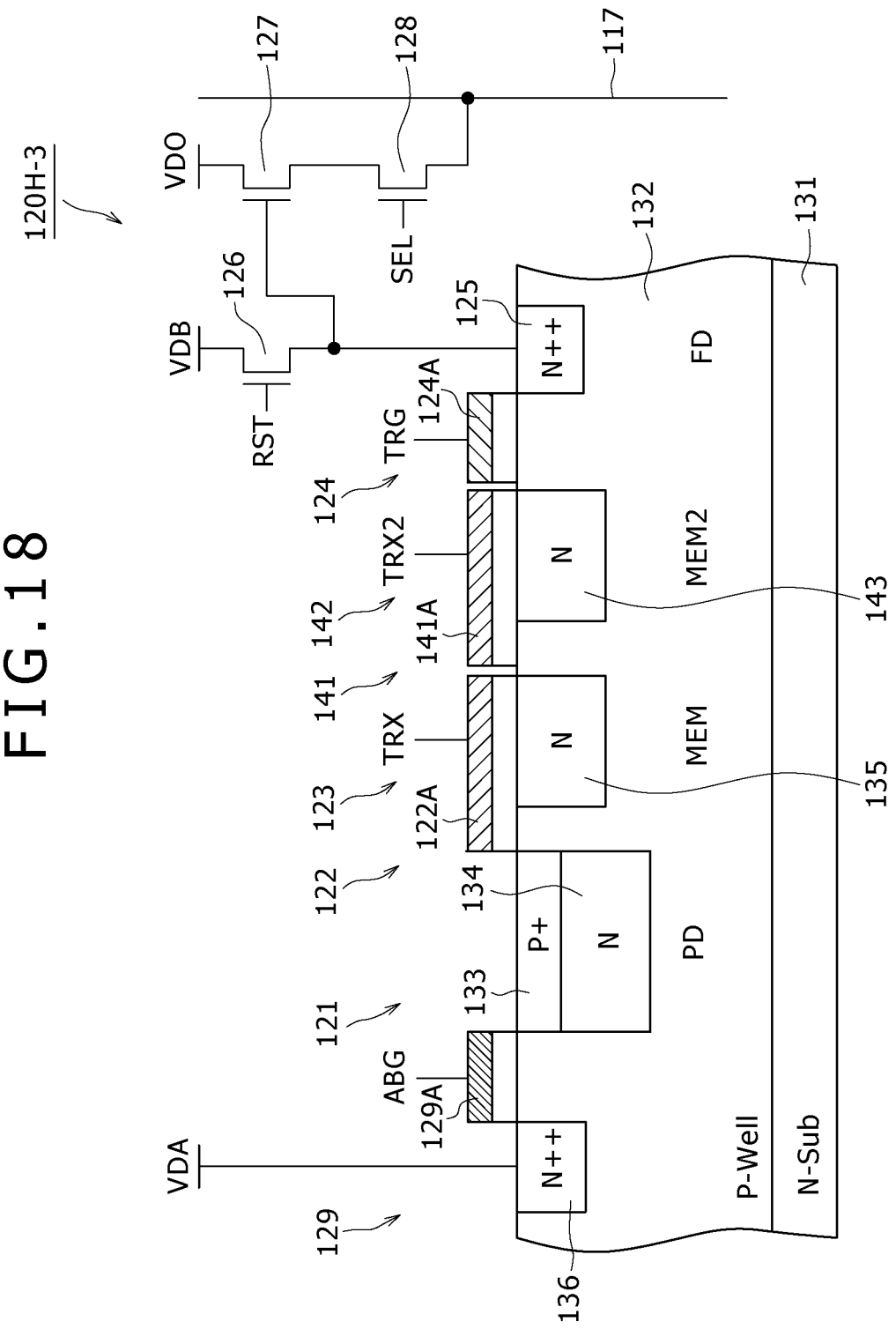
FIG. 18 illustrates the structure of an other third configuration example of the unit pixel.

FIG. 18 illustrates the structure of a unit pixel 120H-3 which is other third configuration example of the unit pixel 120.

In the unit pixel 120A shown in FIG. 2, the single memory part (MEM) 123 has been disposed between the photodiode 121 and the floating diffusion region 125. In the unit pixel 120H-3 of FIG. 18, another memory part (MEM2) 142 is additionally disposed. Thus, the memory part has a two-stage configuration.

A third transfer gate 141 has a function by which the electric charge accumulated in the memory part 123 is transferred when a transfer pulse TRX2 is impressed on a gate electrode 141A. The memory part 142 has an N-type buried channel 143 formed beneath the gate electrode 141A, and accumulates the electric charge transferred from the memory part 123 by the third transfer gate 141. With the memory part 142 thus having the buried channel 143, generation of a dark current at the interface can be restrained, which contributes to enhancement of image quality.

The memory part 142 is the same in configuration with the memory part 123. Therefore, like the memory part 123, the memory part 142 is advantageous in that when modulation is applied, the amount of saturated charge in the memory part 142 can be increased, as compared with the case where modulation is not applied.

In a global exposure operation in the unit pixel 120H-3, light electric charge accumulated simultaneously for all the pixels is held in the photodiode 121 or the memory part 123. The memory part 142 is used for holding the light electric charge until the image signal is read out.

In the unit pixel 120H-3, a buried channel 135 of the memory part 123 and the buried channel 143 of the memory part 142 function as electric-charge holding regions in the case of performing the global exposure operation. In the unit pixel 120H-3, the present invention can be applied by a method in which an overflow path 130 is provided by forming an impurity diffusion region 137 at the first transfer gate 122, and an impurity diffusion region 138 is provided beneath an impurity diffusion region 137.

Thus, the present invention can be adopted also for other structure than the unit pixel 120A. Besides, the present invention can be similarly applied also to unit pixels modified from the unit pixels 120A to 120H-3 by reversing the polarity of conductivity type (N-type, P-type).

[Configuration Example of Electronic Apparatus to which the Present Invention is Applied]

Further, application of the present invention is not limited to application to a solid-state imaging device. The present invention is applicable to electronic apparatuses in general in which a solid-state imaging device is used for an image pickup section (photoelectric conversion section), for example, imaging apparatuses such as digital still cameras, video cameras, etc., personal digital assistants (PDA) having an imaging function, copying machines using a solid-state imaging device for an image readout section, etc. The solid-state imaging device may be formed in a one-chip form, or may be fabricated in a module form having an imaging function in which an imaging section and a signal processing section or an optical system are collectively packaged.

Figure 19:
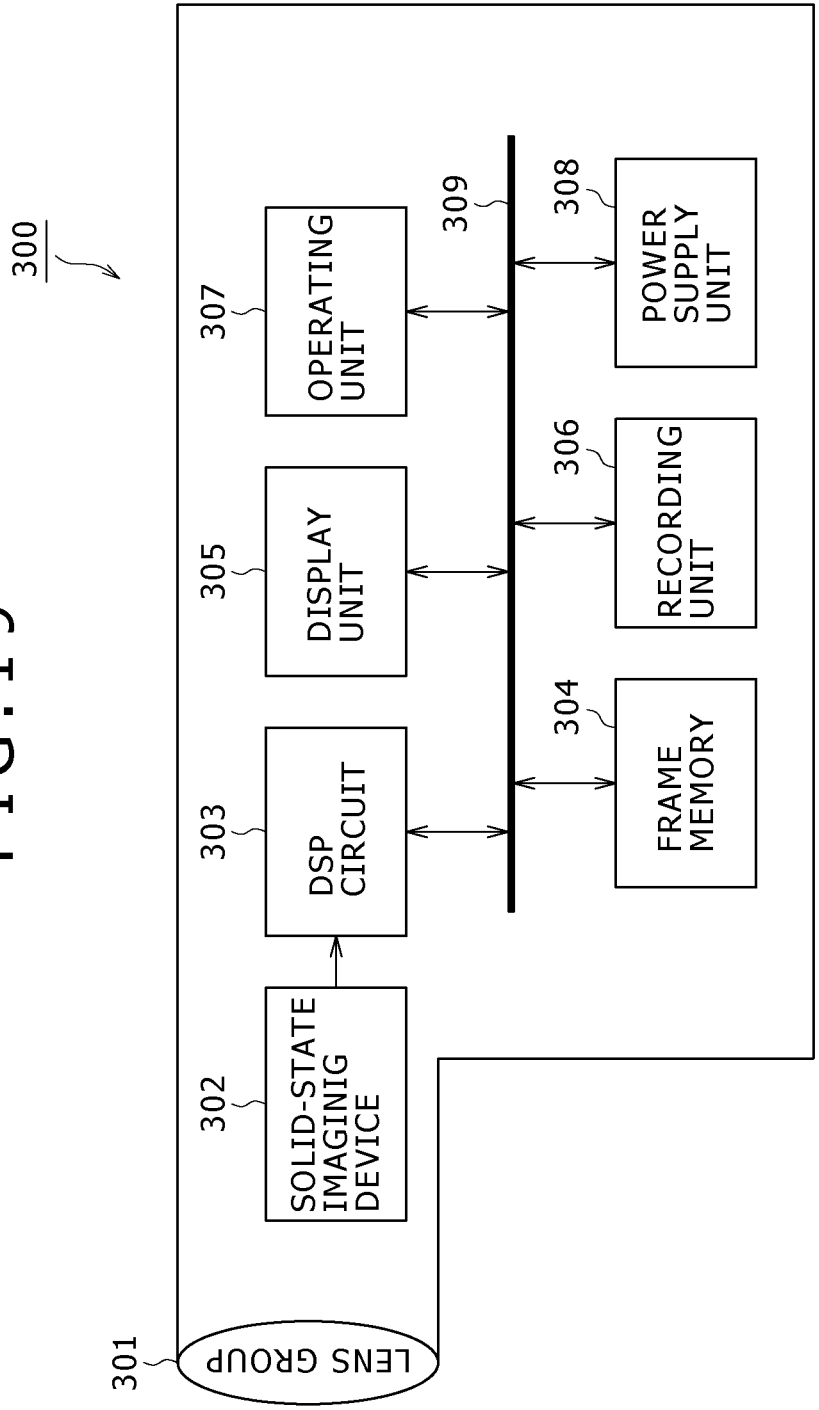
FIG. 19 is a block diagram showing a configuration example of an imaging apparatus as an electronic apparatus to which an embodiment of the present invention is applied.

FIG. 19 is a block diagram showing a configuration example of an imaging apparatus as an electronic apparatus to which the present invention is applied.

The imaging apparatus 300 shown in FIG. 19 includes an optical unit 301 having a lens group or the like, a solid-state imaging device 302 for which each of the configurations of the above-mentioned unit pixels 120 is adopted, and a digital signal processing (DSP) circuit 303 which is a camera signal processing circuit. In addition, the imaging apparatus 300 has a frame memory 304, a display unit 305, a recording unit 306, an operating unit 307, and a power supply unit 308. The DSP circuit 303, the frame memory 304, the display unit 305, the recording unit 306, the operating unit 307, and the power supply unit 308 are connected to one another through a bus line 309.

The optical unit 301 picks up incident light (image light) coming from a subject, and forms an image on an imaging plane of the solid-state imaging device 302. The solid-state imaging device 302 converts the amounts of incident light formed into the image on the imaging plane into an electrical signal on a pixel basis, and outputs the electrical signal as an image signal. As the solid-state imaging device 302, there can be used a solid-state imaging device such as a CMOS image sensor 100, specifically, a solid-state imaging device which can realize distortion-free imaging through global exposure and which can restrict the leak signal suppression ratio on the basis of each of RGB pixels.

The display unit 305 has a panel-type display such as, for example, a liquid crystal panel or an organic electroluminescence (EL) panel, and displays a motion picture or still image picked up by the solid-state imaging device 302. The recording unit 306 records the motion picture or still image, shot by the solid-state imaging device 302, on a recording medium such as a video tape, a digital versatile disk (DVD), etc.

The operating unit 307, under user's operations, issues operation commands relating to the various functions possessed by the imaging apparatus 300. The power supply unit 308 supplies, as required, a variety of electric power to the DSP circuit 303, the frame memory 304, the display unit 305, the recording unit 306, and the operating unit 307, as power for operations of these component units.

As above-mentioned, where a CMOS image sensor 100 according to any of the above-described embodiments is used as the solid-state imaging device 302, it is possible to realize distortion-free imaging through global exposure, and to restrict the leak signal suppression ratio on the basis of each of RGB pixels. Therefore, enhancement of image quality of picked-up images can be contrived, also in such imaging apparatuses 300 as video cameras, digital still cameras, and camera modules for use in mobile apparatuses such as cell phones.

The above embodiments have been described by taking as an example the case where the present invention is applied to a CMOS image sensor in which unit pixels for detecting signal charges according to the amounts of visible light as physical quantity are arranged in a matrix pattern. However, the application of the present invention is not limited to the application to the CMOS image sensor. The present invention is applicable to solid-state imaging devices in general of the column type in which column processing sections are arranged on the basis of each of pixel columns in a pixel array section.

In addition, the application of the present invention is not restricted to the application to a solid-state imaging device for imaging through detection of distribution of the amount of incident visible light. The invention is also applicable to solid-state imaging devices for imaging through detection of distribution of the incident amounts of infrared (IR) rays, X-rays, particles or the like. Further, the invention is applicable to solid-state imaging devices (physical quantity distribution detectors) in general or in wide meaning which perform imaging through detection of distribution of other physical quantity such as pressure, capacitance, etc., for example, fingerprint sensor.

Incidentally, the solid-state imaging device may be fabricated in a one-chip form, or may be fabricated in a module form having an imaging function in which an imaging section and a signal processing section or an optical system are collectively packaged.

It should be understood by those skilled in the art that various modifications, combinations, sub-combinations and alterations may occur depending on design requirements and other factors insofar as they are within the scope of the appended claims or the equivalents thereof.

The present application contains subject matter related to that disclosed in Japanese Priority Patent Application JP 2010-083600 filed in the Japan Patent Office on Mar. 31, 2010, the entire content of which is hereby incorporated by reference.

What is claimed is:

1. A solid-state imaging device comprising:
   a semiconductor region of a second conductivity type which is formed on a face side of a semiconductor substrate;
   a photoelectric conversion element which has an impurity region of a first conductivity type and which is operable to generate electric charge according to the amount of incident light and to accumulate the electric charge in the inside thereof;
   an electric-charge holding region which has an impurity region of the first conductivity type and in which the electric charge generated through photoelectric conversion by the photoelectric conversion element is held until read out;
   an intermediate transfer path which has an impurity region of the first conductivity type disposed in a region between the photoelectric conversion element and the electric-charge holding region and through which only the electric charge generated by the photoelectric conversion element during an exposure period and being in excess of a predetermined electric charge amount is transferred into the electric-charge holding region; and
   an impurity layer having an impurity region of the second conductivity type which is disposed in a region between the photoelectric conversion element and the electric-charge holding region and under the intermediate transfer path and which is higher in impurity concentration than the semiconductor region of the second conductivity type,
   wherein,
      the junction depth of the impurity region of the first conductivity type constituting the intermediate transfer path is shallower than the junction depth of the impurity region of the first conductivity type constituting the electric-charge holding region, and
      the impurity concentration of the impurity region of the first conductivity type constituting the intermediate transfer path is lower than the impurity concentration of the impurity region of the first conductivity type constituting the electric-charge holding region.

2. The solid-state imaging device according to claim 1, wherein the impurity layer having the impurity region of the second conductivity type is formed to have a predetermined impurity concentration such as not to be brought into a depletion state by potentials of the photoelectric conversion element and the electric-charge holding region.

3. The solid-state imaging device according to claim 1, wherein the impurity layer having the impurity region of the second conductivity type is formed to extend to the depth of the lower end of the impurity region of the first conductivity type constituting the electric-charge holding region.

4. The solid-state imaging device according to claim 1, wherein the impurity layer having the impurity region of the second conductivity type is formed to extend from the impurity region of the first conductivity type constituting the intermediate transfer path toward a lower side of the impurity region of the first conductivity type constituting the electric-charge holding region.

5. The solid-state imaging device according to claim 4, wherein the impurity region of the first conductivity type constituting the photoelectric conversion element is formed to extend from an impurity layer formed on a surface of the impurity region of the first conductivity type constituting the photoelectric conversion element toward a lower side of the impurity layer having the impurity region of the second conductivity type which extends toward the lower side of the impurity region of the first conductivity type constituting the electric-charge holding region.

6. The solid-state imaging device according to claim 1, further comprising a transfer gate which is provided on the upper side of the intermediate transfer path and the electric-charge holding region and which transfers electric charge from the photoelectric conversion region into the electric-charge holding region, wherein the region where the impurity region of the first conductivity type constituting the photoelectric conversion element is formed and the transfer gate are so disposed as to overlap with each other in plan view.

7. The solid-state imaging device according to claim 1, wherein the photoelectric conversion element and the electric-charge holding region are formed to have Hole Accumulated Diode structure.

8. The solid-state imaging device according to claim 1, further comprising:
   a first electrode covering the upper side of the intermediate transfer path; and
   a second electrode covering the upper side of the electric-charge holding region,
   wherein,
      the first electrode and the second electrode are separate from each other.

9. A solid-state imaging device comprising:
   a semiconductor region of a second conductivity type which is formed on a face side of a semiconductor substrate;
   a photoelectric conversion element which has an impurity region of a first conductivity type and which is operable to generate electric charge according to the amount of incident light and to accumulate the electric charge in the inside thereof;
   an electric-charge holding region which has an impurity region of the first conductivity type and in which the electric charge generated through photoelectric conversion by the photoelectric conversion element is held until read out an intermediate transfer path which has an impurity region of the first conductivity type disposed in a region between the photoelectric conversion element and the electric-charge holding region and through which only the electric charge generated by the photoelectric conversion element during an exposure period and being in excess of a predetermined electric charge amount is transferred into the electric-charge holding region; and
   an impurity layer having an impurity region of the second conductivity type which is disposed in a region between the photoelectric conversion element and the electric-charge holding region and under the intermediate transfer path and which is higher in impurity concentration than the semiconductor region of the second conductivity type, wherein, the potential state along a line passing in the depth direction through the intermediate transfer path is such that at least one minimum potential point and at least one maximum potential point are formed at positions shallower than the lower end of the impurity region of the first conductivity type constituting the electric-charge holding region and that the maximum potential point is formed at a position deeper than the minimum potential point.

10. A method of manufacturing a solid-state imaging device, comprising the steps of:

forming a photoelectric conversion element which has an impurity region of a first conductivity type and which is operable to generate electric charge according to the amount of incident light and to accumulate the electric charge in the inside thereof;

forming an electric-charge holding region which has an impurity region of the first conductivity type and in which the electric charge generated through photoelectric conversion by the photoelectric conversion element is held until read out;

forming an intermediate transfer path which has an impurity region of the first conductivity type disposed in a region between the photoelectric conversion element and the electric-charge holding region and through which only the electric charge generated by the photoelectric conversion element during an exposure period and being in excess of a predetermined electric charge amount is transferred into the electric-charge holding region; and forming an impurity layer having an impurity region of a second conductivity type different from the first conductivity type and which is disposed in a region between the photoelectric conversion element and the electric-charge holding region and under the intermediate transfer path and which is higher in impurity concentration than a semiconductor region of the second conductivity type formed on a face side of a semiconductor substrate, wherein, the junction depth of the impurity region of the first conductivity type constituting the intermediate transfer path is shallower than the junction depth of the impurity region of the first conductivity type constituting the electric-charge holding region, and the impurity concentration of the impurity region of the first conductivity type constituting the intermediate transfer path is lower than the impurity concentration of the impurity region of the first conductivity type constituting the electric-charge holding region.

11. An electronic apparatus comprising a solid-state imaging device, the solid-state imaging device including:

a semiconductor region of a second conductivity type which is formed on a face side of a semiconductor substrate;

a photoelectric conversion element which has an impurity region of a first conductivity type and which is operable to generate electric charge according to the amount of incident light and to accumulate the electric charge in the inside thereof;

an electric-charge holding region which has an impurity region of the first conductivity type and in which the electric charge generated through photoelectric conversion by the photoelectric conversion element is held until read out;

an intermediate transfer path which has an impurity region of the first conductivity type disposed in a region between the photoelectric conversion element and the electric-charge holding region and through which only the electric charge generated by the photoelectric conversion element during an exposure period and being in excess of a predetermined electric charge amount is transferred into the electric-charge holding region; and an impurity layer having an impurity region of the second conductivity type which is disposed in a region between the photoelectric conversion element and the electric-charge holding region and under the intermediate transfer path and which is higher in impurity concentration than the semiconductor region of the second conductivity type;

wherein, the junction depth of the impurity region of the first conductivity type constituting the intermediate transfer path is shallower than the junction depth of the impurity region of the first conductivity type constituting the electric-charge holding region, and the impurity concentration of the impurity region of the first conductivity type constituting the intermediate transfer path is lower than the impurity concentration of the impurity region of the first conductivity type constituting the electric-charge holding region, of unit pixels arranged in a matrix pattern, the unit pixels in a plurality of rows perform the electric-charge accumulation simultaneously, and the electric charges transferred from the photoelectric conversion elements into the electric-charge holding regions are read out sequentially.

* * * * *